(12) United States Patent
Pichler

(10) Patent No.: US 6,936,761 B2
(45) Date of Patent: Aug. 30, 2005

(54) TRANSPARENT ELECTRODE, OPTOELECTRONIC APPARATUS AND DEVICES

(75) Inventor: Karl Pichler, Santa Clara, CA (US)

(73) Assignee: Nanosolar, Inc., Palo Alto, CA (US)

( * ) Notice: Subject to any disclaimer, the term of this patent is extended or adjusted under 35 U.S.C. 154(b) by 27 days.

(21) Appl. No.: 10/403,997

(22) Filed: Mar. 29, 2003

(65) Prior Publication Data
US 2004/0187917 A1 Sep. 30, 2004

(51) Int. Cl.$^7$ ............... H01L 31/04; H01L 31/0224
(52) U.S. Cl. ............ 136/256; 136/263; 136/252; 257/40; 257/81; 257/82; 257/431; 257/461; 257/99; 257/79; 438/98; 438/82; 438/99; 438/57
(58) Field of Search ............... 136/256, 263, 136/252; 257/40, 81, 82, 431, 461, 99, 79; 438/98, 82, 99, 57

(56) References Cited

U.S. PATENT DOCUMENTS

| | | | |
|---|---|---|---|
| 4,865,999 A | | 9/1989 | Xi et al. ............ 437/2 |
| 4,939,050 A | * | 7/1990 | Toyosawa et al. ........ 429/241 |
| 5,571,612 A | | 11/1996 | Motohiro et al. ........ 428/323 |
| 6,291,763 B1 | | 9/2001 | Nakamura ............ 136/263 |
| 6,414,235 B1 | | 7/2002 | Luch ............ 136/244 |
| 6,444,296 B1 | | 9/2002 | Sasaki et al. ........ 428/209 |
| 6,472,594 B1 | | 10/2002 | Ichinose et al. ........ 136/256 |
| 6,515,218 B1 | | 2/2003 | Shimizu et al. ........ 136/256 |
| 6,517,958 B1 | * | 2/2003 | Sellinger et al. ........ 428/690 |
| 6,586,764 B2 | * | 7/2003 | Buechel et al. ........ 257/40 |
| 6,706,962 B2 | * | 3/2004 | Nelles et al. ........ 136/263 |
| 6,852,920 B2 | * | 2/2005 | Sager et al. ........ 136/263 |
| 2002/0192441 A1 | | 12/2002 | Kalkan et al. ........ 428/209 |
| 2003/0005955 A1 | * | 1/2003 | Shiotsuka et al. ........ 136/251 |
| 2003/0204038 A1 | * | 10/2003 | Xiao et al. ........ 528/10 |
| 2004/0084080 A1 | | 5/2004 | Sager et al. ........ 136/263 |
| 2004/0103936 A1 | * | 6/2004 | Andriessen ........ 136/252 |
| 2004/0146560 A1 | * | 7/2004 | Whiteford et al. ........ 424/484 |
| 2004/0178390 A1 | * | 9/2004 | Whiteford et al. ........ 252/500 |

FOREIGN PATENT DOCUMENTS

| | | | |
|---|---|---|---|
| DE | 2741954 | 3/1979 | ........ H01L/31/18 |
| EP | 1028475 A1 | 8/2000 | ........ H01L/51/20 |
| EP | 1087446 A2 | 3/2001 | ........ H01L/31/0352 |

OTHER PUBLICATIONS

U.S. Appl. No. 60/411,734, filed Sep. 18, 2002.*
M. Granstrom, K. Petritsch, A. C. Arias, A. Lux, M. R. Andersson & R. H. Friend. 1998. Laminated fabrication of polymeric photovoltaic diodes. Nature 395, 257–260, Sep. 1998.

(Continued)

*Primary Examiner*—Alan Diamond
(74) *Attorney, Agent, or Firm*—JDI Patent; Joshua D. Isenberg

(57) ABSTRACT

Transparent conductive electrodes, optoelectronic apparatus, optoelectronic devices and methods for making such electrodes, apparatus and devices are disclosed. The transparent conducting electrode (TCE) includes a layer of transparent electrically conducting polymer material and an array of electrically conductive wires distributed across the layer of transparent electrically conducting polymer material. The TCE may be made by distributing an array of conductive wires across a conductive polymer layer and attaching polymer layer to the wire array. An optoelectronic apparatus may comprise an active layer in electrical contact with the TCE. An optoelectronic device may incorporate an active layer disposed between two electrodes, at least one of which is the TCE. An optoelectronic device may be made by disposing an active layer between a base electrode and a TCE and attaching all three together.

48 Claims, 10 Drawing Sheets

OTHER PUBLICATIONS

Gebeyehu, D., Brabec, C.J., Saricifti, N.S., Vangeneugden, D., Kiebooms, R., Vanderzande, D., Kienberger, F., and H. Schnindler. Hybrid Solar Cells based on dye–sensitized nanoporous TiO2 electrodes and conjugated polymers as hole transport materials. Synthetic Metals 123, 279–287, (2002).

Brabec, C, Sariciftci, N.S., "Recent Developments in Conjugated Polymer Based Plastic Solar Cells." Monatshefte für Chemie 132, 421–431, Springer–Verlag (2001).

G. Sauer, G. Brehm, and S. Schneider, K. Nielsch, R. B. Wehrspohn,a) J. Choi, H. Hofmeister, and U. Gösele, "Highly Ordered Monocrystalline Silver Nanowire Arrays," Journal of Applied Physics, vol. 91, No. 5, Mar. 1, 2002.

D. R. Kammler, T. O. Mason, D. L. Young, T. J. Coutts, D. Ko, K. R. Poeppelmeier, D. L. Williamson, "Comparison of thin film and bulk forms of the transparent conducting oxide solution $Cd_{1+x} In_{2-2x} Sn_x O_4$," Journal of Applied Physics, vol. 90, No. 12, Dec. 15, 2001.

Brian G. Lewis and David C. Paine, "Applications and Processing of Transparent Conducting Oxides," MRS Bulletin, Aug. 2000.

"Applications of High Conductivity Traces in Thin Film Circuits," © 1995 MIC Technology Corporation.

Stefan A. Maier, Mark L. Brongersma, and Harry A. Atwater, "Electromagnetic Energy Transport Along Arrays Of Closely Spaced Metal Rods As An Analogue To Plasmonic Devices," Applied Physics Letters, vol. 78, No. 1, Jan. 1, 2001.

T. W. Ebbesen, H. J. Lezec, H. F. Ghaemi, T. Thio & P. A. Wolff, "Extraordinary Optical Transmission Through Sub––Wavelength Hole Arrays", Nature, vol. 391, Feb. 12, 1998.

H. J. Lezec, A. Degiron, E. Devaux, R. A. Linke, L. Martin–Moreno, F.J. Garcia–Vidal, T.W. Ebbesen, "Beaming Light from a Subwavelength Aperture" Sciencexpress,/ www.sciencexpress.org/Jun. 20, 2002/p. 1/10.1126/science.1071895.

R. Chang, T. Marks, T. Mason, and K. Poeppelmeier, "n/p–Type Transparent Conductors" (Date Unknown).

U.S. Appl. No. 10/290,119, to Brian M. Sager et al., filed Nov. 5, 2002 and entitled "Optoelectronic Device and Fabrication Methods".

U.S. Appl. No. 10/303,665 to Martin R. Roscheisen et al. entitled "Molding Technique for Fabrication of Optoelectronic Devices" and filed on Nov. 22, 2002.

U.S. Appl. No. 10/319,406 to Brian M. Sager et al., filed on Dec. 11, 2002 and entitled "Nano–Architected/Assembled Solar Electricity Cell".

U.S. Appl. No. 10/338,079 to Martin R. Roscheisen et al., filed on Jan. 6, 2003 and entitled "Nanostructured Transparent Conducting Electrode".

Merriam Webster Online Dictionary entry for "substantial" [online], [retrieved on Sep. 15, 2004]. Retrieved from the Internet ,<URL: http://www.m–w.com/cgi–bin/dictionary-?book=Dictionary&va=substantially>.

* cited by examiner

TRANSPARENT ELECTRODE, OPTOELECTRONIC APPARATUS AND DEVICES

CROSS-REFERENCE TO RELATED APPLICATIONS

This application is related to commonly assigned copending U.S. patent applications Ser. Nos. 10/290,119, 10/303,665, 10/319,406 and 10/338,079, all of which are incorporated herein by reference.

FIELD OF THE INVENTION

This invention generally relates to optoelectronic devices and more particularly to transparent conducting electrodes for such devices.

BACKGROUND OF THE INVENTION

Optoelectronic devices interact with radiation and electric current. Such devices can be light-emitting devices that produce radiation as a result of an applied electric voltage/current or photovoltaic devices that produce an electric voltage/current as a result of applied radiation. Photovoltaic (PV) cells/devices typically employ a substrate or carrier (wafer, film, foil, etc.), a bottom electrode, one or more layers of PV material and a top electrode. Either the bottom electrode or the top electrode may be the anode and the opposite the cathode and vice versa. PV materials and layer structures are, broadly speaking, materials that create a voltage and current between the two electrodes when the PV material/layer structure is exposed to light.

In the past PV materials were limited to inorganic materials, for example, silicon (crystalline, poly-crystalline, amorphous), GaAs, CdTe, CIGS, or nano/meso-porous titania-based dye+liquid electrolyte cells ('Graetzel cell'). Recently, organic materials have been used as PV materials. Such organic materials include semiconducting gels, conjugated polymers, molecules, and oligomers. Organic PV materials may also include porous films of sintered particles such as titania particles. These materials may or may not be doped to improve performance (e.g. reduce resistance to improve efficiency). Examples of such organic PV materials are described, e.g., in Brabec, Christoph J. Sariciftci, N. S. "Recent Developments in Conjugated Polymer Based Plastic Solar Cells" 2001, Chemical Monthly, V132, 421–431. One of the great advantages of organic or partly organic solar cells is that they can be made much thinner than e.g. silicon-based PV cells (few 100 nm as opposed to several micrometers).

PV cells may be optimized for solar-cell applications, i.e. applications in which typically outside sun/day-light impinges on the cell and the voltage and current output from the PV cell is optimized/maximized. FIG. 1 depicts a schematic diagram of a typical solar cell according to the prior art. The solar cell 100 generally includes a substrate 102, a bottom electrode 104 disposed on the substrate 102, and one or more active layers 106 disposed between the bottom electrode 104 and a top electrode 108. In such solar cell applications large currents have to be carried from the PV cell(s) to an outside electrical circuit or device. One of the PV cell surfaces, e.g., a top surface 109 has to be at least semi-transparent to collect this outside light but this light also has to penetrate through the electrode on this side. Thus one faces the problem of maximizing light transmission into the cell while minimizing the resistance of said electrode to efficiently (at low power loss) carry the collected current to the outside circuit or device. This is often achieved by using semi-transparent conducting material in at least one of the top and bottom electrodes 104, 108.

The substrate 102 may be transparent or opaque. In cases in which the light of e.g. a PV cell penetrates into the device through the bottom substrate 102 the top electrode 108 does not normally have to be transparent. In cases in which the bottom substrate 102 is opaque the light needs to reach the device (electronically/optically active layer(s)) through the top electrode 108. Naturally, both the top and bottom electrodes 104, 108 and the substrate 102 must be at least partly transparent for the case in which the light is desired to reach the active layer(s) 106 from both sides.

In the prior art, transparent conducting electrodes (TCEs) have typically been made using a transparent conducting oxide (TCO) such as indium-tin-oxide, ITO, or tin oxide, $SnO_x$ (with or without fluorine doping), Al-doped $ZnO_x$, etc.). Such TCO layers have often been combined with metallic grids of additional lower resistance materials, such as e.g. screen-printed metal-particle pastes (e.g. silver-paste). For example, U.S. Pat. No. 6,472,594 to Ichinose et al describes coating metal with a conductive adhesive in order to attach the wires to and make electrical contact with an underlying TCO. Such approaches are still far from optimal as limited light transmission and residual resistances limit device efficiency and manufacturing is costly. Furthermore, such approaches are not compatible with the use of organic PV cells. Ichinose, in particular does not address applications involving organic PV cells.

It is known in the prior art that TCO materials, particularly where they act as anodes to extract and/or inject positive charge carriers, may not form good ohmic or near-ohmic contacts with organic p-type materials such as those employed in organic or partly-organic solar cells. Furthermore, organic or partly organic solar cells are often more sensitive to 'process conditions'. For example, depositing a TCO layer (e.g. via the typical sputtering processes or even reactive sputtering processes that create UV and/or plasma conditions) can damage the organic layers such that cells may, for example have electrical shorts. Because organic solar cells tend to be much thinner than silicon-based PV cells, any damage and/or surface modification due to the TCO deposition process can, hence, be relatively much more relevant and damaging in an organic PV cell. Furthermore, TCO deposition processes typically employ vacuum-coating steps that are difficult and costly, even in a web-based roll-to-roll process.

Conductive polymer films, e.g. Pedot, Pani or polypyrrole, represent an alternative to TCO electrodes. Such polymer materials are far more suitable for roll-to-roll processing, as they can be solution processed/coated. Furthermore, such conductive polymer materials do not require sputtering or plasma processes to put them on an active layer. Unfortunately, after processing such as coating and drying, such conductive polymer films have sheet resistances significantly higher than TCOs; e.g., about 200 Ohms/square. Because of this, the resistive power loss would be far too high. Thus, pure conductive polymer transparent electrodes are unacceptable for PV approaches.

Therefore, a need exists in the art for an improved transparent conducting electrode that overcomes the above disadvantages and a corresponding method for making it.

SUMMARY OF THE INVENTION

The disadvantages associated with the prior art are overcome by embodiments of the present invention directed to optoelectronic apparatus, and methods for making and such apparatus.

According to an embodiment of the invention, an optoelectronic apparatus includes a transparent conducting electrode having a layer of transparent electrically conducting polymer material and an array of electrically conductive wires distributed across the layer of transparent electrically conducting polymer material. The wire array and conducting polymer material are configured such that the wires are in electrical contact with the polymer material. The wires have small diameters, e.g., typically less than about 200 microns. Preferably, the conductive polymer material is conductive polythiophene, conductive polyaniline, conductive polypyrroles, PSS-doped PEDOT (e.g. Baytron™), a derivative of PEDOT, a derivative of polyaniline, a derivative of polypyrrole. Alternatively, the conductive polymer may be a conjugated spiro compound, a spiro polymer, a polymer blend or a polymer mixed/doped with other conjugated materials, e.g., dyes. The wire array, e.g., in the form of parallel wires or a mesh, may have an open area greater than about 80%. The transparent conducting electrode may also include a thin layer of metal. Such transparent conducting electrodes may be used, e.g., in photovoltaic devices such as solar cells.

The optoelectronic apparatus may further comprise an active layer in electrical contact with the transparent conducting electrode. The active layer may include two semiconducting materials having different electron affinities, so that the first and second materials have complementary charge transfer properties. The presence of the first and second semiconducting materials may alternate within distances of between about 5 nm and about 100 nm. The two semiconducting materials may be arrayed using nanostructures such as filled pores, nanolamellas, or matrixed nanostructures. The apparatus may further include a base electrode with the active layer disposed between the base electrode and the transparent conducting electrode.

According to another embodiment of the invention a conductive electrode may be made by distributing an array of conductive wires across a layer of transparent conducting polymer and attaching a transparent conductive polymer layer to the wire array. The wires and conductive polymer are attached such that they make electrical contact with each other. The wire array and/or conductive polymer may be provided in the form of substantially continuous sheets in a roll-to-roll process.

Embodiments of the present invention provide new and useful electrodes and devices that may be formed relatively inexpensively and on a large scale.

DETAILED DESCRIPTION OF THE INVENTION

Figure 1:
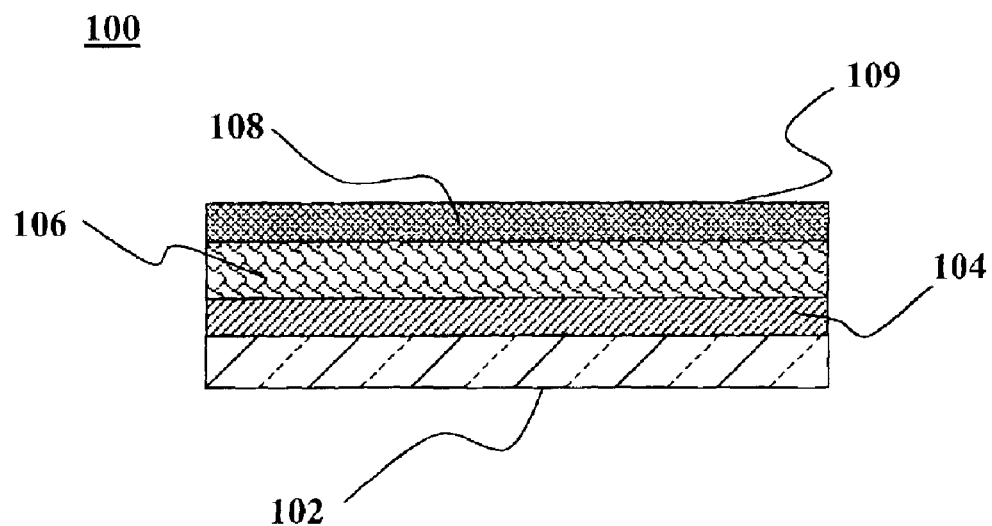
FIG. 1 depicts an optoelectronic device according to the prior art

Contents
I. Glossary
II. General Overview
III. Apparatus Using Transparent Conducting Electrodes
IV. Optoelectronic Devices using Transparent Conducting Electrodes
V. Fabrication of Transparent Conducting Electrodes
VI. Fabrication of Apparatus, and Devices
VII. Alternative Embodiments
VIII. Conclusion I. Glossary The following terms are intended to have the following general meanings as they are used herein:

Device: An assembly or sub-assembly having one or more layers of material.

Semiconductor: As used herein, semiconductor generally refers to a material characterized by an electronic bandgap typically between about 0.5 eV and about 3.5 eV.

Hole-Acceptor, Electron-Acceptor: In the case of semiconductor materials, hole-acceptor and electron-acceptor are relative terms for describing charge transfer between two materials. For two semiconductor materials wherein a first material has a valence band edge or highest occupied molecular orbital (HOMO) that is higher than the corresponding valence band edge or HOMO for a second material, and wherein the first material has a conduction band edge or lowest unoccupied molecular orbital (LUMO) that is higher than the corresponding conduction band edge or LUMO for the second material, the first material is a hole-acceptor with respect to the second material and the second material is an electron-acceptor with respect to the first material. A particular band edge or molecular orbital is said to be "higher" when it is closer the vacuum level.

Complementary charge-transfer properties: As used herein, a first and second semiconductor or conductor material are said to have complementary charge-transfer properties with respect to each other when the first material is a hole-acceptor and/or hole-transporter with respect to the second and the second is an electron-acceptor and/or electron-transporter with respect to the first or vice versa.

Nano-Architected Porous Film: As used herein "nano-architected porous film" generally refers to a film of material having features characterized by a width, or other characteristic dimension, on the order of several nanometers ($10^{-9}$ m) across. Nano-architected porous films may be produced by several techniques, including:

(a) Intercalation and/or grafting of organic or polymeric molecules within a mineral lamellar network comprised of clays, phosphates, phosphonates, etc. The lamellar compounds serve as a network host that preserves the preestablished structural order. Organic molecules are then inserted or grafted into this pre-structured network (which is comprised of mineral(s)).

(b) Synthesis by electrocrystallisation of hybrid molecular assemblies. This synthesis technique drives the construction of highly organized mineral networks with relatively long-range order that can be controlled and adjusted for electronic intermolecular transfer.

(c) Impregnation of preformed inorganic gels. In an example of this technique, a silica xerogel can be formed by hydrolysis and polycondensation of silicon alkoxides with organic monomers (e.g. with monomers that are susceptible to polymerization within the porous gel structure). Methylmethacrylate (MMA) is an example of a suitable organic monomer and the inorganic-organic hybrid obtained after polymerization of the MMA has optical and mechanical properties often superior to the individual components.

(d) Synthesis from heterofunctional metallic alkoxides metallic halides or silsesquioxannes: Precursors of this kind have the formula $R_xM(OR')_{n-x}$ or $3(R'O)Si—R''—Si(OR')3$, where R and R' are either hydrogen (H), any organic functional group or a halide, R" can be oxygen or an organic functional group, and M is a metal. Typically R and R' involve oxygen, e.g., —O—R and —O—R'. M may be any transition metal, e.g., titanium, zinc, zirconium, copper, lanthanum, niobium, strontium, or silicon, etc. The hydrolysis of alkoxy groups (OR') followed by a condensation reaction will form the mineral network and the R groups will imprint in the network the organic function.

(e) Synthesis of hybrid networks through the connection of well-defined functional nanobuilding Blocks. The preformatted species or building blocks could be in this case oxo-metallic clusters, nanoparticles, nano-rods, nano-tubes, nano-whiskers (CdS, CdSe, ... ), metallic or oxides colloids, organic molecules or oligomers. These blocks are functionalized during or after their synthesis with complementary species for tailoring the interface between organic and inorganic domains.

(f) Templated growth of inorganic or hybrid networks by using organic molecules and macromolecules as structure directing agents. In general, molecules like amines, alkyl ammonium ions, amphiphilic molecules or surfactants can be used as templates to build a structured mineral network. Materials of the zeolites families are among the most intensively investigated systems. Molecular and supramolecular interactions between template molecules (surfactants, amphiphilic block copolymers, organogelators, etc ... ) and the growing hybrid or metal-oxo based network permit the construction of complex hybrid hierarchical architectures.

(g) Templated growth using nanoparticles, as structuring agents followed by removal of the nanoparticles, leaving behind a porous network. The nanoparticles may be made, e.g., of latex, and removed, e.g., by heating the templated film to a sufficient temperature to "burn off" the nanoparticles.

Surfactant Templation: In general, surfactant temptation is a particular subcategory of templated growth. As used herein, surfactant temptation refers an approach toward achieving pore size control of inorganic or organic frameworks, e.g., by using surfactants or block copolymers as templates to build a structured mineral network. Surfactant temptation may be used to prepare a high-porosity surfactant-templated porous thin film. Surfactant temptation includes the sol-gel approach described below.

Optoelectronic Device: A device that interacts with radiation and electric current. Such a device could be a radiation-emitting device, e.g. a light-emitting diode (LED) or laser, or a radiation absorbing device, e.g. a photodetector/counter, photovoltaic cell (solar cell) or radiation-driven electrolysis cell.

Solar Cell: A photovoltaic device that interacts with radiation (often in the form of sunlight) impinging on the device to produce electric power/voltage/current Organic Solar Cell: A type of solar cell wherein an active photoelectric layer is fabricated, either partly or entirely, using organic materials comprising, e.g., polymers, oligomers, molecules, dyes, pigments (including mixtures) that are predominantly carbon based compounds. These materials may be insulating, conductive or semiconductive or mixes thereof.

Radiation: Energy which may be selectively applied including electromagnetic energy having a wavelength between $10^{-14}$ and $10^4$ meters including, for example, gamma radiation, x-ray radiation, ultraviolet radiation, visible light, infrared radiation, microwave radiation and radio waves.

Material: The term "material" is used herein to refer to solid-state compounds, extended solids, extended solutions, clusters of molecules or atoms, crystals, polymers, dyes, particularly including conjugated polymers and dyes.

Inorganic Materials: Materials which do not contain carbon as a principal element. The oxides and sulphides of carbon and the metallic carbides are considered inorganic materials. Examples of inorganic compounds include, but are not restricted to, the following:

(a) Intermetallics (or Intermediate Constituents): Intermietallic compounds constitute a unique class of metallic materials that form long-range ordered crystal structures below a critical temperature. Such materials form when atoms of two metals combine in certain proportions to form crystals with a different structure from that of either of the two metals (e.g., NiAl, $CrBe_2$, CuZn, etc.).

(b) Metal Alloys: A substance having metallic properties and which is composed of a mixture of two or more chemical elements of which at least one is a metal.

(c) Inorganic polymers such as polysilanes or other non-carbon based polymers or monomers.

(e) Ceramics: Typically, a ceramic is a metal oxide, boride, carbide, nitride, or a mixture of such materials. Examples of such materials include, among others, alumina, zirconia, Titania ($TiO_2$) silicon carbide, aluminum nitride, silicon nitride Organic Materials: Compounds, which principally consist of carbon and hydrogen, with or without oxygen, nitrogen or other elements, except those in which carbon does not play a critical role (e.g., carbonate salts). Examples of organic materials that can be synthesized using the methods of the present invention include, but are not restricted to, the following:

(a) Organic Dyes and pigments such as perylenes, phthalocyanines, merocyanines, terylenes and squaraines and their derivatives.

(b) Polymers: Materials consisting of large macromolecules composed of more than one repeating units. Polymers, composed of 2–8 repeating units are often referred to as oligomers. Examples of such repeating units include, e.g., dyes or pigments. Polymers can be natural or synthetic, cross-linked or non-crosslinked, and they may be homopolymers, copolymers, block-copolymers, or higher-ordered polymers (e.g., terpolymers, etc.). Polymers may be synthesized or grafted onto one another using either classical organic chemistry techniques or using enzymes to catalyze specific reactions. Examples of polymers include, but are not limited to, the following: (polyurethanes, polyesters, polycarbonates, polyethyleneimines, polyacetates, polystyrenes, polyamides,). Although the preceding are examples of electrically insulating polymer materials, some types of polymers may act as semiconducting or conducting materials. These include semiconductive polymers such as polyphenylvinylene (and derivatives), polythiophene (and derivatives), polyfluorenes (and derivatives), polyparaphenylene and polymers containing $C_{60}$ or dyes such as perylenes or phthalocyanines), conjugated polymers such as polyanilines, polyacetylenes, polypyrroles, and conjugated spiro-compounds, spiro-polymers, polymer blends and polymers mixed/doped with other conjugated materials (e.g. dyes). Conjugated polymers such as PEDOT (Baytron), polyaniline or polyacetylene may be doped to act as conducting polymers. These polymers can be regular polymers, polymer blends, copolymers (regular or random), block-copolymers (regular or random), side-chain polymers, etc.

Shadow Loss: As used herein, shadow loss refers generally to the losses in photovoltaic efficiency associated with wire mesh transparent electrodes in a photovoltaic cell. The wires in the mesh trend to cover an area through which radiation would otherwise pass, thereby reducing the amount of radiation that penetrates to the active layer of the cell.

Solution processing: As used herein, solution processing refers to forming a film on a substrate by applying a solution (or suspension, dispersion, emulsion; from organic solvents, acidic solutions or water-based solutions) to the substrate with some subsequent drying/baking/cure step in which the solvent(s) is/are removed.

II. General Overview

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

Embodiments of the electrode of the present invention is achieved by a combination of a thin-film highly transparent conductive polymer material such as—PEDOT (PEDOT is polyethylene-dioxythiophene doped with polystyrene sulphonic acid (PSS)) or polyaniline (Pani) (typically also doped with e.g. PSS) or doped polypyrroles or any combinations of these or their derivatives and a highly conductive array very fine metal wires with large pitch or a metal mesh with a large ratio of metal to openings. The wires are in electrical contact with the conductive polymer thin-film. The array of metal wires may be laminated or 'woven into' or extruded into/onto the surface a thin film device (in particular PV cell). The metal wires may include a conductive epoxy or meltable cladding to provide electrical contact with the conductive polymer material. A transparent conductive oxide (TCO) may optionally be disposed over the wires and conductive polymer. The TCO could also be disposed between the wire array/conducting polymer combination and an underlying active layer.

Transparent conductive electrodes of the type described herein may be incorporated into organic PV cells and optoelectronic devices. In particular, such electrodes may be incorporated in optoelectronic devices having one or more nanostructured active layers.

Embodiments of the invention can be applied where radiation penetrates the active layer(s) of an optoelectronic device from one side, e.g., through a top electrode or from two sides, e.g., through a top AND a bottom electrode.

Embodiments of the present invention have several advantages over previous transparent electrodes and optoelectronic devices and apparatus. Such advantages include relatively low sheet resistance, relatively low cost and more convenient manufacture compared to prior art transparent electrodes.

III. Apparatus Using Transparent Conducting Electrode

FIGS. 2A–2E depicts schematic diagrams of embodiments of an apparatus 200 according to an embodiment of the present invention. The apparatus 200 generally includes a transparent conducting electrode (TCE) 202A disposed on an active layer 201. The TCE 202A generally includes an array of metal wires 206 distributed across a layer of transparent conductive polymer 204 The metal wires 206 are in electrical contact with the transparent conductive polymer layer 204. The wire array 206 may also be in direct physical contact with the transparent conductive polymer layer 204. The equivalent sheet resistance of the conductive TCE 202 is typically less than 100 Ohms/square, preferably less than 10 Ohms/square, more preferably less than 1 Ohms/square and most preferably less than 0.1 Ohms/square.

The active layer 201 interacts with radiation and electric current or voltage. Such an interaction may be a photovoltaic or light-emitting interaction. The active layer 201 may be a multi-layer structure having two or more sub-layers stacked on top of one another. Alternatively, the presence of two or more materials may alternate with the plane of the active layer. In general, the active layer 201 may include one or more semiconductor materials. By way of example active layer 201 may include silicon, which may be doped with p-type and/or n-type dopant. The silicon may be crystalline, poly-crystalline or amorphous. Other materials suitable for the active layer 201 include inorganic semiconductors (crystalline, poly-crystalline or amorphous) such as CdTe, CIGS, etc. The active layer 201 may be a PV-active layer that converts incident radiant energy to electrical energy.

Alternatively the active layer 201 could include one or more organic materials (molecules, oligomers, polymers, co-polymers, blends) of one or more layers or phase-separated blends. By way of example, suitable polymers include conjugated polymers, (e.g., semiconductive polymers such as polyphenylvinylene, polythiophene, polyfluorenes, polyparaphenylene and polymers containing $C_{60}$ or dyes such as perylenes or phthalocyanines) or conductive polymers such as doped PEDOT (Baytron), polyaniline or polyacetylene. Other suitable organic materials include organic pigments or dyes, azo-dyes having azo chromofores (—N=N—) linking aromatic groups, phthalocyanines including metal-free phthalocyanine; (HPc), perylenes, naphthalocyanines, squaraines, merocyanines and their respective derivatives, poly(silanes), poly (germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f']diisoquinoline-1,3,8,10-tetrone.

The active layer 201 may include a nano-architected porous film. For example, the active layer 201 may include a combination of a nanostructured grid of porous inorganic conductive oxide such as, but not exclusively limited, to titania (in its various phases) wherein the pores in the nanostructured grid are filled with combinations of pore-filling materials such as conjugated organic materials (molecules, oligomers, polymers, copolymers, blends, spiro-compounds), organo-metallic sensitizing dyes (such as ruthenium complexes), solid or liquid electrolytes and/or ionic or electronic charge transporting compounds, inorganic semiconductive compounds (e.g. $CuO_x$, CIGS) and the like. The porous conductive oxide and the pore filling material have complementary charge-transfer properties. For example, a negative-charge transporting porous titania grid may be filled with a positive charge transporting material such as $CuO_x$.

The transparent conductive polymer layer 204 may be made from any of a number of conductive polymers. Preferably, the conductive polymer layer 204 is made from conductive polythiophenes, conductive polyanilines or conductive polypyrroles, PSS-doped PEDOT (e.g. Baytron™), a derivative of PEDOT, a derivative of polyaniline, a derivative of polypyrrole, The conductive polymer layer is typically between about 50 nm and about 5000 nm thick, preferably between about 100 nm and about 1000 nm and more preferably between about 100 nm and about 500 nm thick. Preferably, the conductive polymer material for the conductive polymer layer 204 is solution-processible. Solution processing is advantageous for several reasons, e.g. in that one can e.g. roll-to-roll-coat the solution (or suspension, dispersion, emulsion, etc.) onto a substrate to form the polymer layer 204.

The TCE 202A may include an optional first layer 203 (e.g. a very thin metal layer or transparent conductive oxide) may define the charge injection/extraction efficiency (e.g. via, its work-function) and the conductive polymer layer may increase the electrical conductivity of the TCE 202A and provide electrical contact with the array metal wires 206. For example, the first layer 203 may be a transparent conductive oxide (TCO) such us indium-tin-oxide, Al-doped $ZnO_x$, F-doped $SnO_x$, or the like that fills the spaces between the wires 206. Alternatively the first layer 203 maybe a very thin layer of a metal or alloy. In general, the thin metal or alloy layer used as the first layer 203 must be thin enough that it is sufficiently transparent, e.g., less than about 15 nm thick. The first layer 203 could be a different conductive polymer layer, i.e. different from the transparent conductive polymer layer 204. Specifically, the first layer 203 could be a conductive polymer layer optimized for charge injection/extraction Whereas the transparent conductive polymer layer 204 may be optimized for transparency and conductivity and contact with the wire array 206.

Figure 2A:
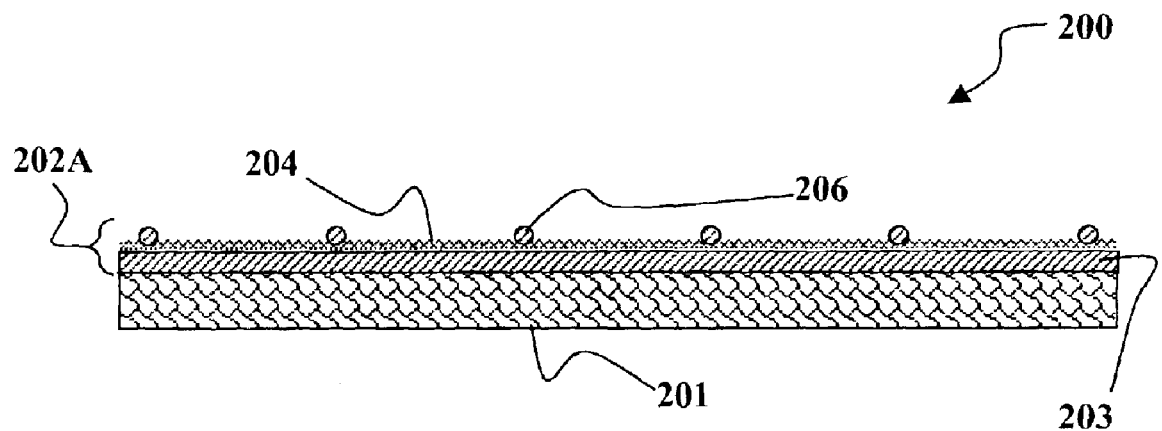
FIGS. 2A–2D depict cross-sectional schematic diagrams of examples of optoelectronic apparatus that incorporate embodiments of transparent conducting electrodes according to embodiments of the present invention.

There are several different configurations for the TCE 202 that incorporate an optional first layer 203, e.g., as a TCO or thin metal (or metal alloy) layer in electrical contact with the conductive polymer layer 204 and/or wire array 206. For example, the wire array 206 may be disposed between the first layer 203 and the conductive polymer layer 204. Alternatively, the TCO or thin metal layer may be disposed between the wire array 206 and the conductive polymer layer 204. More preferably, the conductive polymer layer 204 may be disposed between the first layer 203 and the wire array 206 as shown in FIG. 2A. This configuration is especially preferable when using a thin metal or alloy as the first layer 203.

The first layer may have either a higher or lower work function than the transparent conducting polymer layer 204 depending on the desired application for the TCE 202A. For example, a higher work function for the first layer 203 may be desirable in some applications where the TCE 202A acts as an anode (i.e., a positive charge carrier collecting electrode for a PV cell or detector or a positive charge injecting electrode for other devices). In some applications where the TCE 202A acts as a cathode (i.e., a negative charge carrier collecting electrode for a PV cell or detector or a negative charge injecting electrode for other devices) a lower work function may be desirable for the first layer 203.

There are several variations on the TCE 202A of FIG. 2A. For example, in an alternative embodiment, the array of wires 206 may be placed between the transparent conductive polymer layer 204 and the active layer 201. In some situations, direct electrical contact between the wires 206 and the active layer 201 is undesirable. In such cases the under-side of the array of wires 206 may be partially or fully coated to protect against such undesirable electrical contact.

Figure 2B:
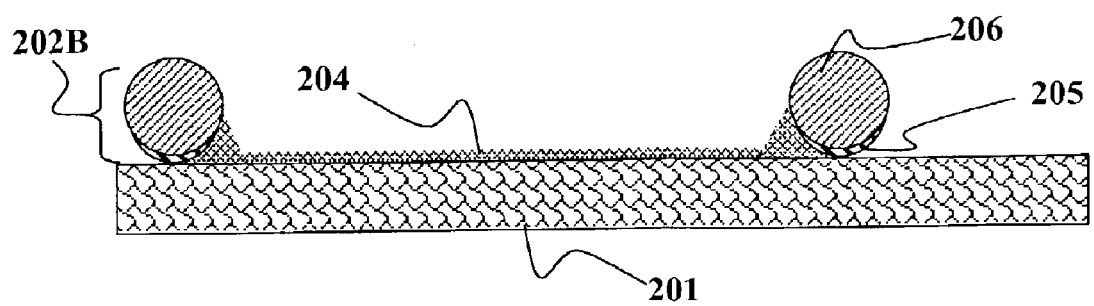

Other variations on the TCE 202A are possible. For example FIG. 2B depicts a variation on the apparatus 200 in which a TCE 202B includes a layer of short-proofing material 205 disposed between the wires 206 and active layer 201. The short proofing material 205 may be an insulating layer 205 e.g. a plastic, a resin such as an epoxy-resin or an inorganic insulator (oxide, nitride, oxynitride, etc.) to protect against such undesirable short circuits. The short-proofing material 205 may be pre-deposited on the wire 206 or deposited during the lamination process. The short-proofing material 205 may also be pre-deposited on the active layer 201 before the wire 206 is put down. FIG. 2B also shows that portions of the conductive polymer layer 204 may "creep-up" the sides of the wire 206, e.g., under the influence of surface tension forces, to provide contact between the wire 206 and the conductive polymer layer 204. The short-proofing material 205 may be deposited in a paste or solution/suspension/dispersion form or be laminated (e.g. in the form of a tape).

It is desirable for the metal wires 206 to be made from wire material for which an industrially stable supply is available and which may be readily formed into wires or meshes. It is also desirable that the metal composing the metal wires 206 possess a low resistivity, e.g., $10^{-4}$ Ω cm or less, more preferably below $10^{-5}$ Ohm cm. For example, copper, silver, gold, platinum, aluminum, molybdenum and tungsten are suitable because of their low electric resistance. Of these, copper, silver, and gold are the most desirable due to their low electric resistance. Alternatively, the wires 206 may be made of aluminum or steel. In particular, Al, Cu, Ag etc have resistivities in the range of around $3 \times 10^{-6}$ Ohm cm. The wires 206 can be made from alloys of two or more metals. The wires 206 may also be made from a low melting point or reflowable/remeltable low temperature alloy/metal (such as a solder alloy) that can be melted onto or into the underlying conductive polymer layer 204.

If desired, thin metal layers may be formed on the surface of the metal wires 206, e.g., by plating or cladding, for purposes such as corrosion prevention, oxidation prevention, improvement of adhesion, and improvement of electric conductivity. For example, precious metals, such as silver, palladium, silver-palladium alloy, and gold, as well other metals, such as nickel and tin, offer good corrosion resistance. Of these, gold, silver, and tin are not readily affected by moisture, therefore making them suitable for corrosion resistant metal layers. It is also possible to create a coating of conductive resin in which the metals are used as fillers and distributed throughout the resin. The wire/mesh could also be pre-coated (before or during the lamination process) with a conductive polymer. Though the thickness of the coating will depend on individual preferences, the coating thickness for metal wires with a circular cross section may lie in a range of about 1% to about 10% of the diameter of the underlying wire.

The sheet resistance for a TCE the type shown in FIGS. 2A–2E can be quite low. For example, for a TCE using 50-micron diameter Cu or Ag or Al wire with a thread count of one wire per millimeter this would equate (not counting the much more resistive conductive polymer) to an equivalent sheet resistance of about 0.01 Ohms/square.

Figure 2C:
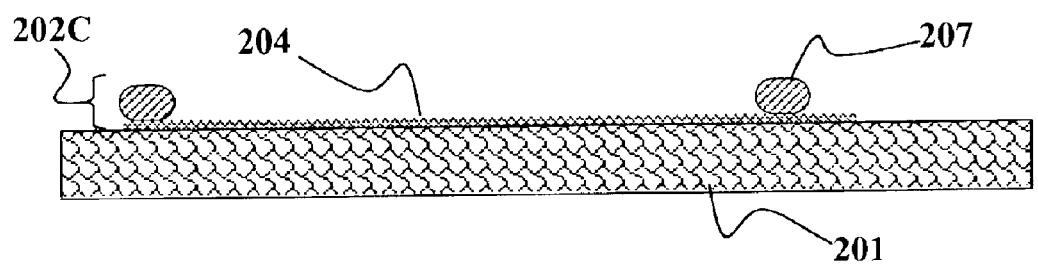

The diameter of the wire 206 is chosen to minimize or substantially reduce the effects of electric resistance loss and shadow loss. The wires 206 desirably have a diameter that is less than about 200 microns and preferably less than about 100 microns and could be less than about 50 microns. The percentage of open area (i.e., area not covered by wire 206) compared to the wire-covered area is preferably better than about 80%, more preferably higher than about 90% and even more preferably higher than about 95%. The cross section of the wire 206 can be substantially circular as shown in FIGS. 2A–2B or, as shown in FIG. 2C, wires 207 with cross sections flattened into an oval or elliptical shape may be used in an alternative TCE 202C. Alternatively, the wire 206 can have a rectangular, irregular or arbitrary cross-section.

Figure 2D:
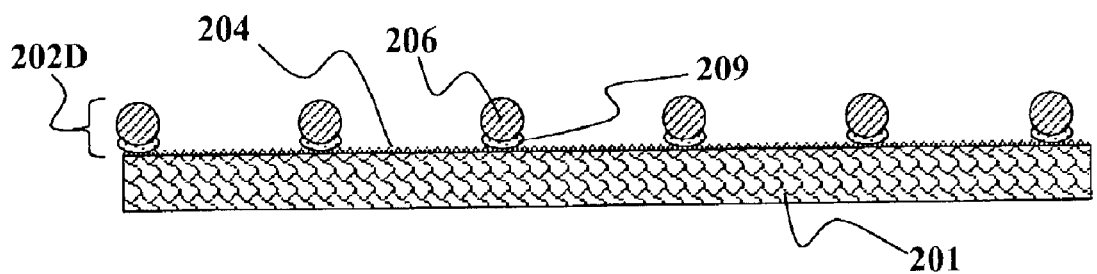

The wire 206 may be brought into contact with the transparent conductive polymer layer 204 by proximity, pressure, heat-treatment (partial or more complete melting or re-flow), or by surface tension forces, etc. Alternatively as shown in FIG. 2D, another alternative TCE 202D may incorporate an adhesive layer 209 between the array of wires 206 and the conductive polymer layer 204. Such an adhesive layer 209 could be a conductive paste or epoxy deposited by extrusion, dispensing, spray-coating, printing such as screen-printing, ink-jet printing, flexographic printing, gravure printing, micro-gravure printing, and the like. Tape-automated bonding (TAB) may also be used. The adhesive layer 209 could be pre-coated on the wire/mesh (or substrate) or be deposited onto the mesh during the lamination/assembly process e.g. via a roll-to-roll coating technique. The adhesive layer 209 may be continuous or not.

Figure 2E:
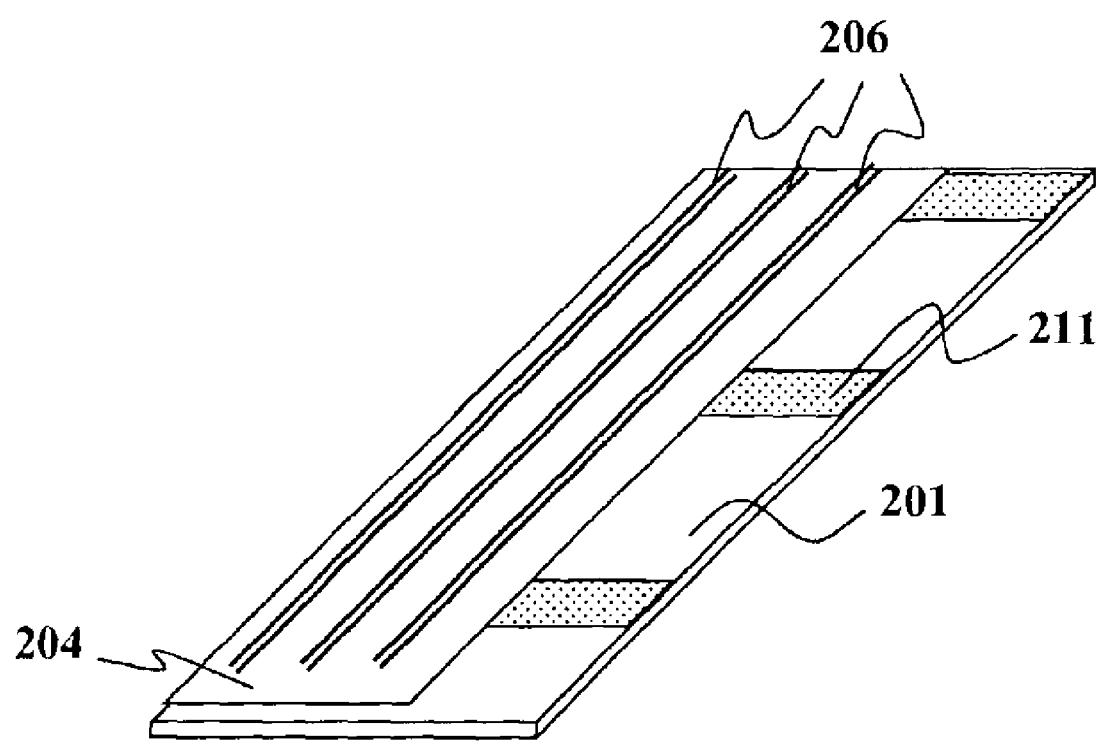
FIG. 2E depicts an isometric schematic diagram of an example of an optoelectronic apparatus according to another embodiment of the present invention.

The use of certain adhesives in the adhesive layer 209 may be incompatible with an organic active layer 201. For example, a high temperature conductive adhesive or meltable or reflowable substance may melt through and/or into the organic layer(s) and cause damage. To overcome this, a short-proofing layer 211 may be disposed between the wire 206 and the active layer 201 or pre-patterned on the active layer such that the short proofing layer 211 protects the conductive polymer layer 204 while the latter still make, contact between the active layer 201 and the wire 206. The short-proofing layer 211 is typically made from an electrically insulating material, e.g., an oxide, glass, or insulating polymer. In a preferred embodiment the short-proofing layer 211 covers only a small area that provides the direct contact between the wire 206 and the active layer 201 such that the conductive polymer coating 204 still provides sufficient contact from the 'open areas' to the wires 206. Note that the adhesive layer 209 described above could be used for a conductive adhesive layer as well as an insulating layer between the wire 206 and the active layer 201. For example, as shown in FIG. 2E, the short-proofing layer 211 may be in the form of one or more strips of insulating material disposed between the conducting polymer layer 204 and the wire 206. The short-proofing layer 211 can also help to protect against shorts between the top and bottom electrodes of an optoelectronic device during a subsequent singulation/cutting/stamping/etc. step, e.g. in create individual sheets of devices originally fabricated in a roll-to-roll process.

The scope of the present invention includes various combinations of the features illustrated in FIGS. 2A–2E. Furthermore, although the first layer 203 (thin metal/alloy or TCO or other conductive polymer) is not shown in FIGS. 2B–2E, such a layer may of course be included in any or all of these variations.

Figure 3:
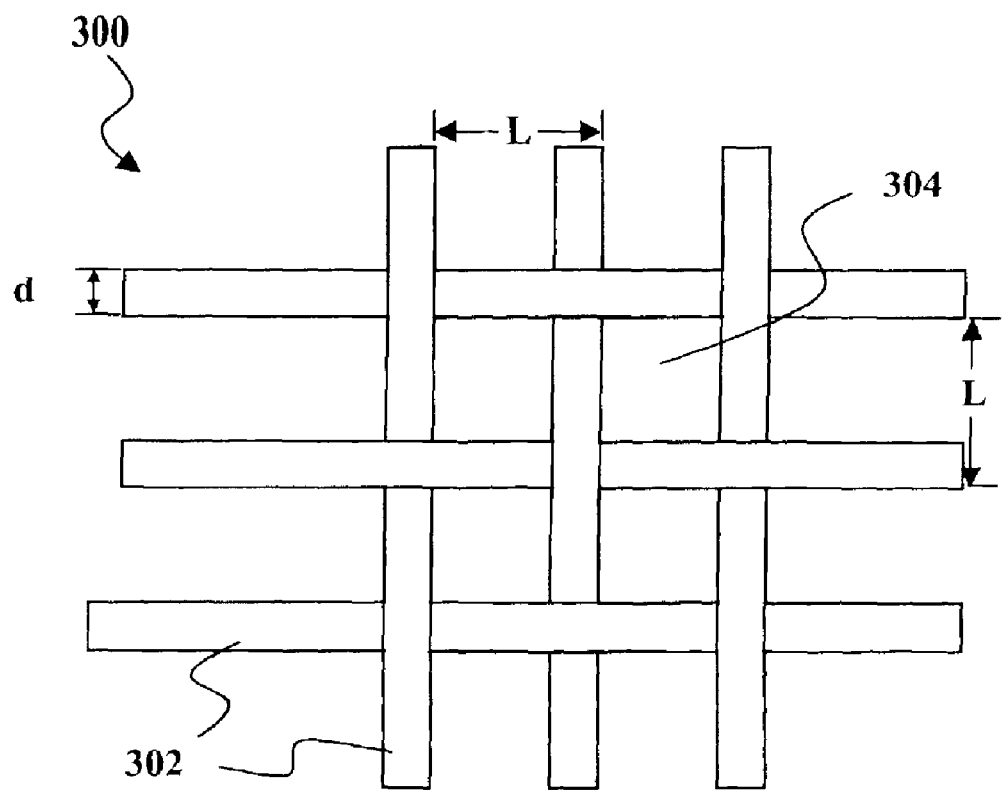
FIG. 3 depicts a diagram of one possible array of wires for a transparent conducting electrode according to an embodiment of the present invention

The wires 206 may be in the form of an array of parallel wires that are substantially uniformly spaced apart from each other, as shown in FIG. 2E. Alternatively, the wires 206 may be arranged in a grid or mesh as shown in FIG. 3. Although a rectangular mesh 300 is depicted in FIG. 3, the mesh 300 may have wires 302 arranged in any suitable pattern such as square grid, honey-comb/hexagonal etc. The mesh 300 may be made of wires of the types described above with respect to FIGS. 2A–2E. In roll-to-roll manufacturing the wire/mesh may be continuous or semi-continuous, may be (if wire form) deposited parallel to the roll-to-roll direction or perpendicular or at an angle in between.

The wires 302 are generally characterized by a diameter d, and are spaced apart to define one or more openings 304 having a characteristic dimension L. As shown in the example of FIG. 3, the characteristic dimension L may be a spacing between adjacent wires 302. The number of wires per unit length in the mesh 300 may be calculated as 1/L. In the example depicted in FIG. 3, the spacing L between vertical fibers is the same as that for horizontal fibers although the spacings may be different if desired. Furthermore, although a substantially rectangular web pattern is depicted in FIG. 3, other patterns with openings having differently defined characteristic dimensions may be used. The wires 302 may be woven, knitted or otherwise fashioned into a fabric having useful properties using conventional fabric forming equipment. In the example depicted in FIG. 3, the wires 302 are depicted as being fashioned in a "woven" pattern, wherein fibers running in one direction alternately pass over and under fibers running in a substantially perpendicular direction.

Other configurations of the wires 302 may be used when fashioning the mesh 300. For example, in some applications a woven mesh is undesirable because it provides an uneven surface for adhering the mesh 300 to an underlying layer. In particular, a fabric-type mesh can have higher and lower points that may increase the risk of shorting during a lamination process. To overcome this, the mesh 300 may be fabricated or pre-treated so that it is essentially flat on at least one side (that in contact with the active layer or other underlying layer(s).

Where the wire spacing L is roughly the same as or substantially larger than the wavelength of radiation incident upon it, the transparency of the resulting web 300 depends on the ratio of open area between the wires 302 to the area $L^2$, which includes the area covered by the wires 302. The open area can be determined by subtracting the area covered by the wires 302 (approximately 2dL in this example) from the total area $L^2$. The open area ratio depends on the both the fiber spacing L and the fiber diameter d. For the mesh example depicted in FIG. 3, the open area ratio may be given approximately by:

OPEN AREA RATIO=[1-2d/L]

For an array of parallel wires of diameter d separated by a spacing L, e.g., like that shown in FIG. 2E, the open area ratio may be given by:

OPEN AREA RATIO=[1-d/L]

Thus, for wires of a given diameter d, a desired open area ratio may be obtained by fashioning a mesh 300 with an appropriate thread count (1/L) By way of example, the wires 302 may be a few tens of microns in diameter and the thread count may be of order 1 wire per mm and the open area ratio may be about 80% or more.

Figure 4:
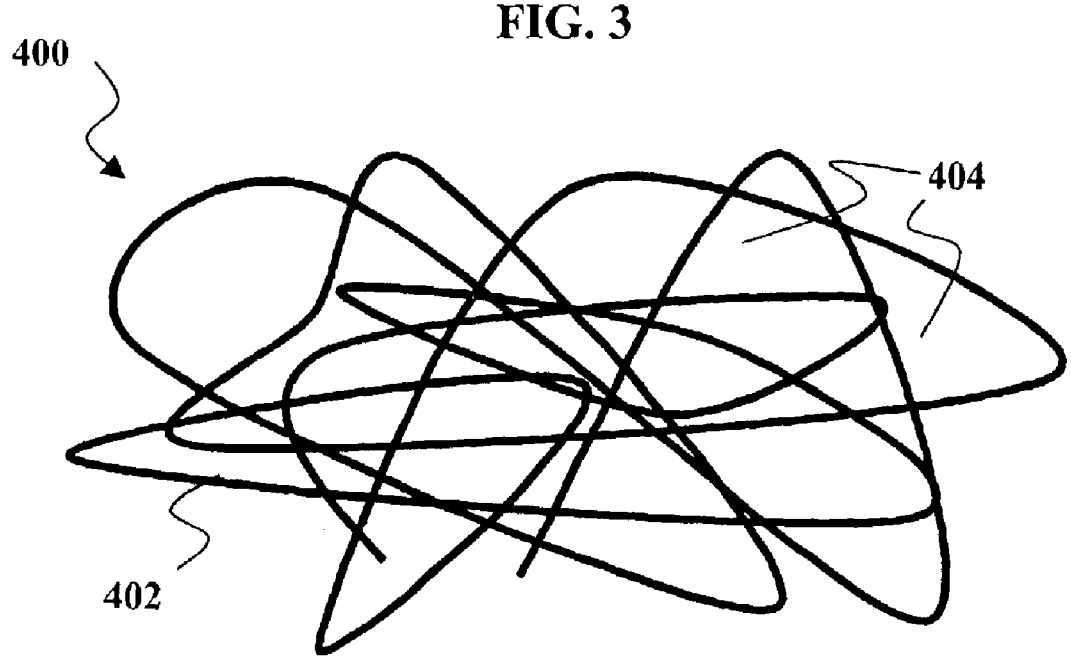
FIG. 4 depicts a diagram of another possible array of wires for a transparent conducting electrode according to an embodiment of the present invention.

In an alternative embodiment the array of wires 206 may alternatively be fashioned in the form of a web with randomly sized and/or randomly shaped openings. For example, FIG. 4 depicts a portion of a web 400 with randomly sized and shaped openings 404 may be fashioned from one or more strands of wire 402, made from an electrically conducting material as described above. The wire 402 may be placed on a substrate or roller in a random pattern and subjected to pressure, and possibly heat, to compress it into a 2-dimensional or 3-dimensional web 400. This is a fairly simple process well suited to forming a web 400 from wires 402 that are between a few microns to a few millimeters in diameter.

Whether in the form of a parallel array, mesh or web, the array of wires 206 generally lies within a surface that substantially conforms to a surface on which the TCE 202 is disposed. In the examples of FIGS. 2A–2E, the TCE (202A, 202B, 202C, 202D, etc.) is disposed on the surface of the active layer 201, which may be substantially planar. In such cases, the wires 206 lie substantially within a plane. Of course it is also possible for the TCE 202 to coat an object of arbitrary shape or regular shape, e.g., cylindrical, spherical, etc. As such, embodiments of the present invention are not limited to planar TCE's, planar optoelectronic apparatus, and planar optoelectronic devices.

IV. Optoelectronic Devices Using Transparent Conducting Electrodes

A. Examples of Devices

Transparent conducting electrodes of the types described above with respect to FIGS. 2A–2E, 3, and 4 may be incorporated into a number of optoelectronic devices. Examples of such devices include passive devices such as antistatic films, antireflective stacks, electromagnetic shielding, heat-efficient electrochemical windows, electrochromic windows and electroluminescent lamps. Additional examples include active devices such as flat panel displays (FPD), light emitting diodes and light-sources, laser diodes, transparent membrane switches, touch screens, and solar cells. Examples of solar cells include thin-film organic, inorganic or hybrid organic/inorganic solar cells as well as conventional non-thin-film solar cells, e.g. based on Si wafers. In each of these types of devices, energy savings can be generated during device operation through the lower resistivity of the transparent conductive electrode.

B. Optoelectronic Device Architecture

According to an embodiment of the present invention, an optoelectronic device includes an active layer sandwiched between two electrodes, at least one of which is a transparent conducting electrode having a thin-film highly transparent conductive polymer material and a highly conductive array of fine metal wires, as described above.

Figure 5:
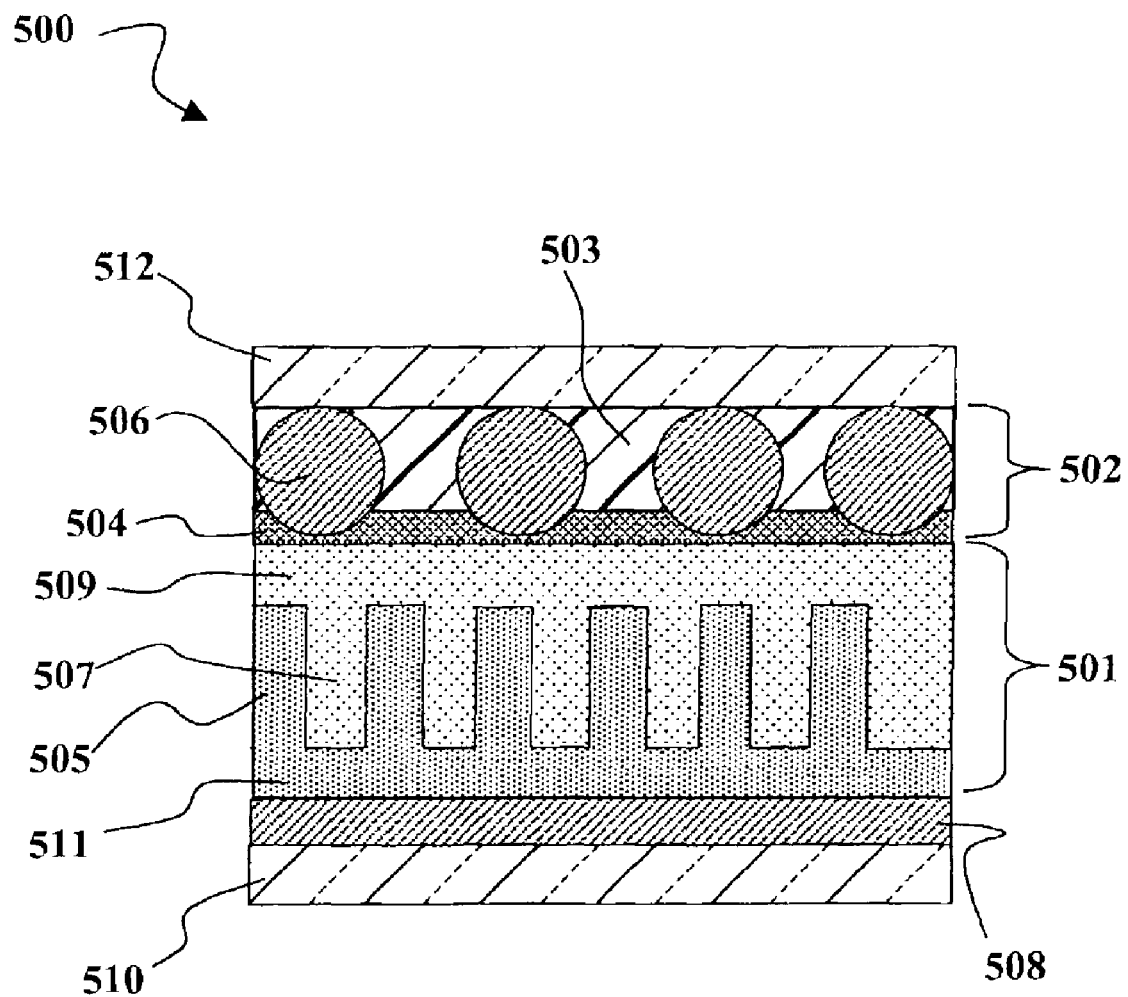
FIG. 5 depicts a cross-sectional schematic diagram illustrating an example of an optoelectronic device according to an embodiment of the present invention.

FIG. 5 depicts an example of a device structure for an optoelectronic device 500 according to an embodiment of the present invention. The optoelectronic device 500 generally includes an active layer 501 disposed between a transparent conducting electrode (TCE) 502 a base electrode 508. The device 500 may be modularized by well-known encapsulation in order to improve weather resistance and mechanical strength e.g., with optional substrate and/or encapsulant layers 510, 512.

The TCE 502 has features in common with those described above with respect to FIGS. 2A–2E and FIGS. 4–5. In particular, the TCE 502 generally includes a layer of transparent conductive polymer 504 covered with an array of metal wires 506. The layer of transparent conductive polymer may 504 be, e.g., a layer of PEDOT or any of the other polymer materials described above. By way of example, and without loss of generality, the array of wires 506 may be in the form of a fine copper mesh having wires about 50 µm in diameter and an open area of about 79%. The wires 506 may have a circular cross-section or a flattened cross-section as described above with respect to FIG. 2C.

The lateral spaces between the wires 506 may be filled with a transparent material 503. Examples of suitable transparent material 503 include clear thermoplastic materials. The transparent material 503 could be used to glue the whole underlying structure to the encapsulation sheet 512 to the TCE 502. Alternatively, the transparent material 503 may include a transparent conducting oxide (TCO) that his been deposited over the wires 506 and conductive polymer material 504. The TCO may not fill the whole space between the wires 506, polymer 504 and encapsulant 512. In such a case, the remainder of the space may be filled with a clear glue or other fill material. The TCE 502 may optionally include an insulator layer as described above with respect to FIGS. 2B and/or 2E or an adhesion layer as described above with respect to FIG. 2D.

The base electrode 508 may optionally be a TCE, e.g., of the type described above. Whether the base electrode 508 is transparent or not depends partly on the nature of the device 500. For example, if the device 500 is a window (e.g., an electrochemical or electrochromic window) both electrodes 502, 510 need to be transparent. On the other hand for radiation emitting devices such as LED's or laser diodes or radiation absorbing devices such as PV cells the base electrode 508 need not be transparent. In such a case, the base electrode 508, may be in the form of a commercially available sheet material such as such as C-, Au-, Ag-, Al-, or Cu-coated Steel Foil or metal/alloy-coated plastic foils, including metal or metallised plastic substrates/foils that are planarized to reduce surface roughness.

In general, the active layer 501 may include a single layer of material or multiple layers. The active layer 501 may generate, absorb, or transmit radiation that passes through the transparent electrode 502. For example, in an electrochromic window, the active layer may comprise a polymer electrolyte disposed between a layer of vanadium pentoxide and a layer of tungsten oxide. The passage of a small current between the electrodes 502, 508 changes the tungsten oxide from transparent to substantially opaque. In another example the active layer 504 may include a liquid crystal layer disposed between to alignment layers. Such structures may be used, e.g. in liquid crystal displays.

In the particular example shown in FIG. 5, the active layer 501 may be in the form of an exciton-splitting and charge transporting network. Such an exciton-splitting network typically includes two complementary semiconductor materials. In general, the two semiconducting materials will have different electron affinities. Interaction between radiation and charge occurs in the vicinity of an interface between the two different materials in the active layer 501. To increase the effective area of the interface, the two complementary semiconductor materials may be in the form of a nanoscale grid network 505 and a network-filling material 507. In such a case, two semiconducting materials may be regularly arrayed such that presence of the two semiconducting materials alternates within distances of between about 5 nm and about 100 nm.

The active layer 501 may include an optional first interface layer 509 that contacts the TCE 502. One function of the first interface layer 509 is to avoid e.g. shorts between the TCE 502 and the nanoscale grid network 505. The interface layer 509 may also include a metal or alloy layer having a lower work-function than the TCE 502 as described above with respect to the first layer 203 of FIG. 2A. The first interface layer 509 may also improve mechanical properties such as flexibility. The active layer 501 may also include a second optional interface layer 511 that contacts the base electrode 508. The second interface layer 511 may inhibit electrical shorts between the base electrode 508 and the network filling material 507. The second interface layer may optionally include a metal or alloy layer with a lower work-function than the base electrode 508.

The nanoscale grid network 505 and network filling material 507 are shown in simplified form for the sake of clarity. Although the structures in the grid network 505 may be aligned substantially parallel to each other as shown in FIG. 5, the structures may also be interconnected and, most importantly, accessible from both neighboring layers, e.g. electrodes 502, 508 or interface layers 509, 511. One possible variation, among others, of a possible configuration of the structures in a nanoscale grid network is that shown in FIG. 9. Although a nanostructured active layer 501 is depicted in FIG. 5, the active layer 501 may alternatively be of conventional design.

The nanoscale grid network 505 may contain substantially uniformly distributed, e.g., regularly spaced, structures roughly 1 nm to 100 nm in diameter and more preferably, about 5 nm to about 25 nm in diameter. In general, neighboring structures are between about 1 nm and about 100 nm apart, measured, e.g., from nearest edge to nearest edge. More preferably, the pores are between about 5 nm apart and 25 nm apart, edge to edge. By way of example, and without loss of generality, the nanoscale grid network 505 may be made from an electron-accepting material, e.g., Titania, ($TiO_2$) zinc oxide ($ZnO_2$), zirconium oxide, lanthanum oxide, niobium oxide, aluminum oxide, tungsten oxide, strontium oxide, calcium/titanium oxide, sodium titanate, potassium niobate, Cadmium Selenide (CdSe), Cadmium Sulfide (CdS), or Cadmium Telluride (CdTe) as well as blends of two or more such materials such as $TiO_2/SiO_2$ blends/hybrids. In such a case, the network filling material may be made from a hole accepting material. The first optional interface layer 509 may inhibit or prevent direct contact between the nanoscale grid network 505 and the transparent electrode 502. The first interface layer 509 may be made from the same material as the network filling material 507.

The network-filling material 507 fills the spaces between the structures in the nanoscale grid network 505. The spaces between the structures may be in the form of pores in layer of porous material. Alternatively, the spaces between the structures may be gaps left behind when pores in a porous material have been filled with a pore-filling material and the porous material etched away leaving behind structures made from the pore-filling material. The second optional interface layer 511 may inhibit or prevent direct contact between the network filling material and the base electrode 508. The second interface layer 511 may be made from the same material as the nanoscale grid network 505. Where the nanoscale grid network 505 is an electron accepting material, the network-filling material 507 is a complementary, i.e., hole-accepting and hole-transporting, organic semiconducting material. Examples of suitable semiconducting organic materials include those set forth above with respect to the active layer 201.

The optional encapsulants 510, 512 protect the device 500 from the surrounding environment. The encapsulants 510, 512 may also absorb UV-light to protect organic materials disposed between the encapsulants 510, 512. Examples of suitable encapsulant materials include one or more layers of glass or polymers, such as polyethylene terephthalate (PET) and/or Mylar®. Mylar is a registered trademark of E. I. du Pont de Nemours and Company of Wilmington, Del. Either encapsulant layers 510, 512 may include EVA (ethylene vinyl acetate), which has favorable adhesive, weather resistance, and buffer effect properties.

In order to further improve moisture resistance and scratch resistance, a fluorine resin may laminated the encapsulant layers 510, 512 as a surface protecting layer. For example, tetra-fluoro ethylene copolymer (TFE, Du Pont TEFLON), copolymer of tetra-fluoroethylene and ethylene (ETFE, Du Pont TEFZEL), polyvinyl fluoride (Du Pont TEDLAR), polychlorofluoroethylene (CTFEC, Daikin Industries Neoflon) are cited. Weather resistance can also be improved by adding a well-known UV absorber. In addition to glass, other inorganic materials, such as ceramics and metal foils may also be used for the encapsulants 510, 512. The encapsulants 510, 512 may also include nitrides, oxides, oxynitrides or other inorganic materials that protect against exposure to water or air. In particular, the encapsulant may be a multi-layer stack or a foil comprising a multi-layer stack of organic materials with inorganic dielectrics.

V. Fabrication of Transparent Conducting Electrodes, Apparatus, and Devices

A. General Approach

Transparent conducting electrodes, apparatus and devices of the types described above may be manufactured in accordance with an inventive method. An example of a method 600 for fabricating a transparent conducing electrode is illustrated generally by the flow diagram of FIG. 6 and the schematic diagrains shown in FIG. 7A and FIG. 7B. The method 600 begins at 602 by distributing an array of conductive wires across a layer of transparent conducting polymer material. At 604, adhesives and/or insulating material may optionally be placed between the wires and polymer material as described with respect to FIGS. 2B and 2D. At 606, the cross-sections of the wires may be flattened as described above with respect to FIG. 2C. Preferably, this flattening is done prior to any lamination of the wire array to the transparent conductive polymer layer. At 608 the conductive wires are attached to the layer of conductive polymer material to form a transparent conducting electrode. The attaching process in 608 is such that the conductive wires are brought into electrical contact with the layer of transparent conducting polymer material to produce a transparent conductive electrode. The order of the steps depends on the nature of the fabrication process. Some of the steps may occur sequentially, others may occur simultaneously.

In a preferred embodiment, prior to step 602 either the wires or the polymer material are first disposed on an underlying sheet, e.g., a substrate or active layer at step 601. The underlying sheet may be a partially fabricated optoelectronic device, e.g., like the device 500 of FIG. 5 with all layers up to the first interface layer 509. The conducting polymer material may be formed on the sheet first, e.g., by applying a solution or suspension to the sheet. Then at step 602 the wires may be embedded in the wet solution and the solution may be cured. Alternatively, the wires may be disposed on the sheet first and the solution disposed over the wires at and then cured at step 602.

B. Roll-to-Roll Processing

Figure 6:
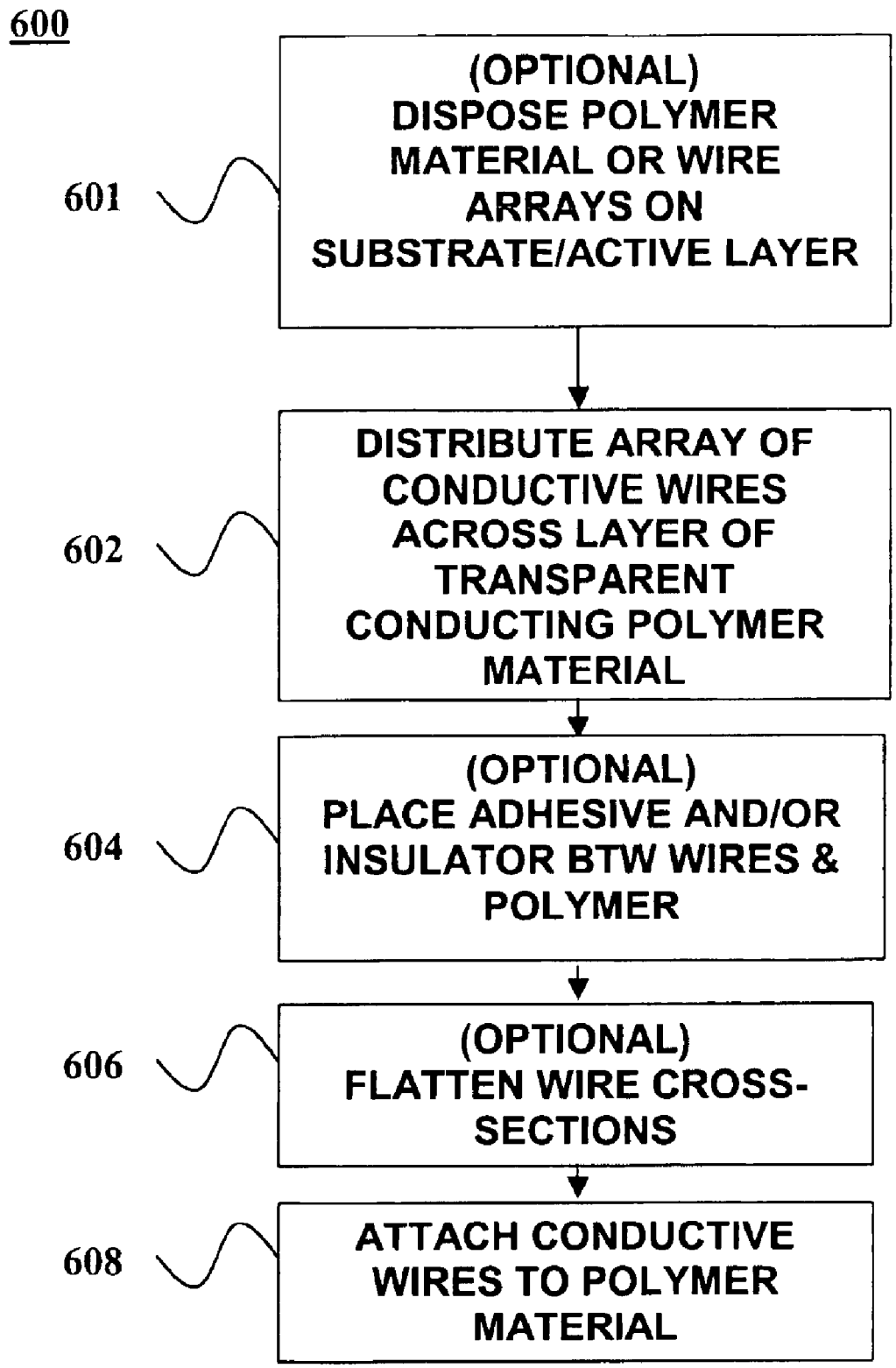
FIG. 6 depicts a flow diagram of a method for making transparent conducting electrodes according to an embodiment of the present invention.
Figure 7A:
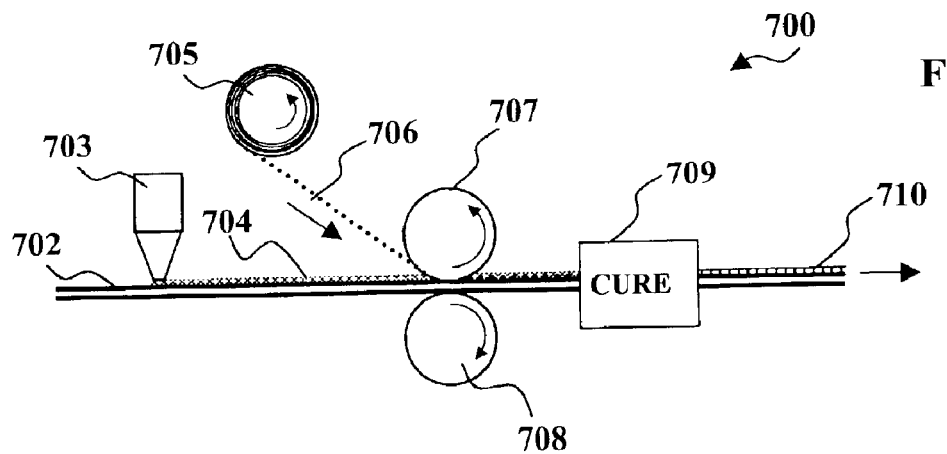
FIGS. 7A–7C depicts schematic diagrams of roll-to-roll processes for producing transparent conducting electrodes according to an embodiment of the present invention.

The fabrication process described in FIG. 6 may be implemented in a number of different ways. For example, FIG. 7A depicts a schematic diagram of an embodiment of one possible apparatus 700 for forming a TCE on an underlying sheet. In this embodiment a dispenser 703 applies a process solution 704 to an underlying sheet 702. The sheet 702 may be a substrate material or a partially completed optoelectronic device sheet. A roll 705 supplies a wire array 706. Rollers 707, 708 laminate (with or without the application of pressure) the wire array 706 into the wet solution 704. The sheet 702 carries the solution 704 and wire array 706 to a curing unit 709. The curing unit 709 dries, heats, and/or irradiates the solution 704 to set it into a transparent conducting polymer to form a TCE 710 attached to the underlying sheet 702. The sheet 702 with the attached TCE 710 may then be encapsulated and/or cut into smaller individual sections. The apparatus 700 may optionally include a deposition stage for depositing a TCO, thin metal layer or second layer of conductive polymer. Such a deposition stage may implement sputtering or electron beam evaporation or the like for TCO deposition or thermal/resistive evaporation, electron beam evaporation, ion plating, sputtering and the like for thin metal layer deposition. The TCO or thin metal layer may be deposited on the sheet 702 before applying the process solution 704 or on the TCE 710 after curing the process solution 704. A second conductive polymer layer may be deposited on the underlying sheet 702, e.g., from a process solution or dry coating process, before depositing the process solution 704 and/or wire array 706.

Figure 7B:
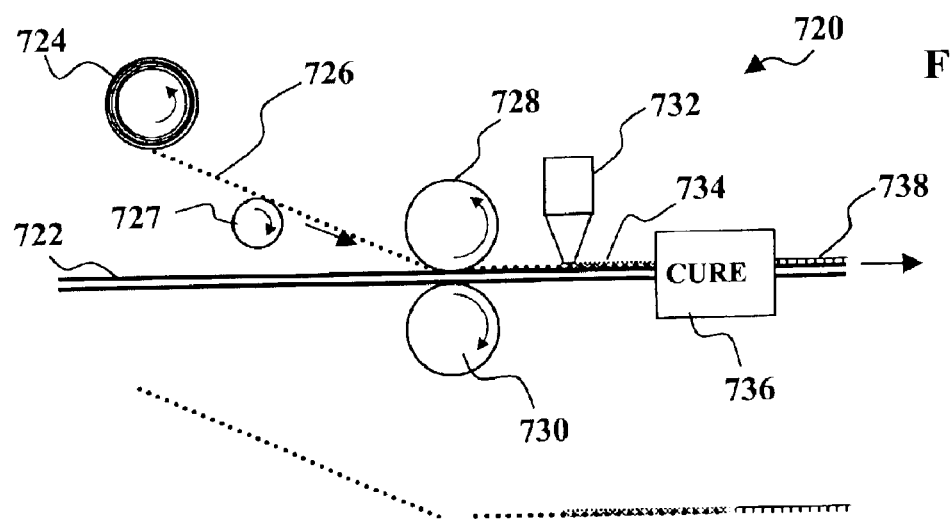

FIG. 7B depicts an alternative apparatus 720, which is a variation on the apparatus 700. The apparatus 720 forms a TCE 738 attached to an underlying sheet 722 such as a substrate or partially completed device. In the apparatus 720, a roll 724 provides a wire array 726. An applicator 727 (e.g., a roller) applies an adhesive to an underside of the wire array 726. Rollers 728, 730 laminate (with or without the application of pressure and/or heat) the wire array to the sheet 722. An applicator 732 then applies a process solution 734 to the wire array 726 and through spaces between the wires in the array to the sheet 722. A curing unit 736 then cures the process solution 734 to form a transparent conductive polymer layer. The conductive polymer layer and the wire array 726 form the TCE 738 attached to the underlying sheet 722. The sheet 722 with the attached TCE 738 may then be encapsulated and/or cut into smaller individual sections. The apparatus 720 may also include a stage (not shown) for depositing (e.g., sputtering) a TCO or thin metal layer on the sheet 722 before or after attaching the wire array 726 or after curing the process solution 734.

Alternatively, the applicator roller 727 may apply a second conductive polymer layer to the underside of the wire array 726. A conductive polymer coating layer (as additional option on top of the adhesive and/or insulating layers discussed earlier) could provide an effective conductive 'glue' with little or reduced risk of causing damage to the underlying active layer(s) by the wire lamination.

Processing of the type depicted in FIG. 7A and FIG. 7B is particularly advantageous because of the economies of scale associated with roll-to-roll production. The fabrication schemes depicted in FIGS. 7A and 7B are particularly advantageous when using solution processing. Both schemes allow the TCE to be baked to remove solvents prior to encapsulation or lamination of other layers on top of the TCE. In addition, the transparent electrode described herein facilitates the 'rolling-up' (e.g. for temporary storage, curing, baking, transport, etc.) of the laminate whereby the wire array 706 provide a spacer and protection for the active device during and in the 'rolled-up' state.

Figure 7C:
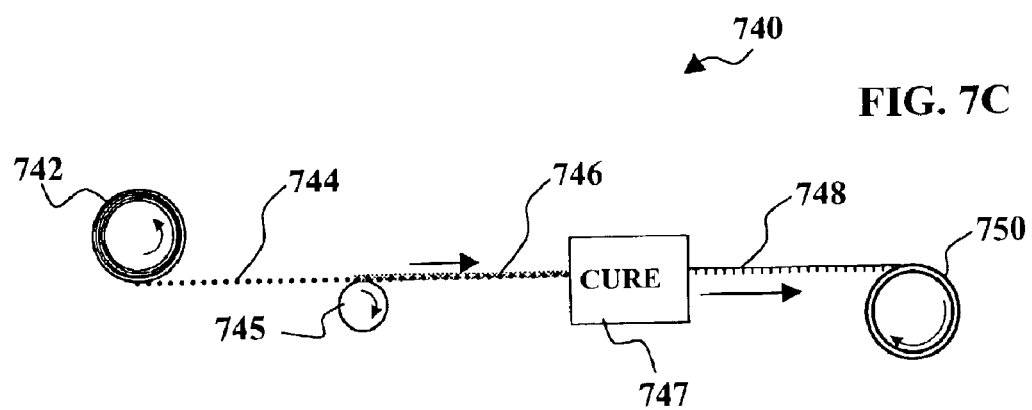

In an alternative embodiment, transparent conducting electrodes of the type described above may be manufactured by a roll-to-roll process without an underlying sheet. e.g., by coating a mesh foil with a transparent conductive polymer. For example, FIG. 7C schematically illustrates roll-to-roll processing to produce a transparent conducting electrode of the type described above. Specifically, in a roll-to-roll apparatus 740 a feeder roll 742 provides an array of conductive wire 744, preferably in the form of a regular screen, mesh, grid or the like.

An applicator roller 745 may apply a process solution 746 the wire array 744 that will form a transparent conductive polymer material to implement the features described above with respect to FIG. 2B and/or FIG. 2D. After the process solution 746 is applied, the wire array 744 may pass through a curing stage 747. Prior to the applicator roller 745, the wire array 744 may also pass between an optional pair of compression rollers (not shown) to provide the wires 744 with flattened cross-sections as described with respect to FIG. 2C.

The curing stage 747, may apply some combination of heat, drying and/or radiation to the polymer process solution 746 and/or wire arrays 744. The curing process attaches the wire array to the transparent conductive polymer layer to from a transparent conductive electrode sheet 748. After the curing stage 747, a take-up roller 750 may then collect the transparent conductive electrode sheet 748. Alternatively, the transparent conductive electrode sheet 748 may move to a further processing stage in which it may be laminated directly to a substrate and/or other parts of a semi-finished device.

Other alternative fabrication schemes may combine various features described above with respect to FIGS. 7A–7C. Such alternatives include (a) doing all the fabrication steps on a sheet basis and (b) doing some steps on a sheet basis (e.g. up to layer 502 in FIG. 5) on a roll-to-roll and doing the final lamination to a sheet encapsulation layer (512 in FIG. 5) after 'singulation' of the roll (i.e., after forming the TCE and/or device into a single sheet).

VI. Fabrication of Apparatus and Devises

A. General Approach

Figure 8:
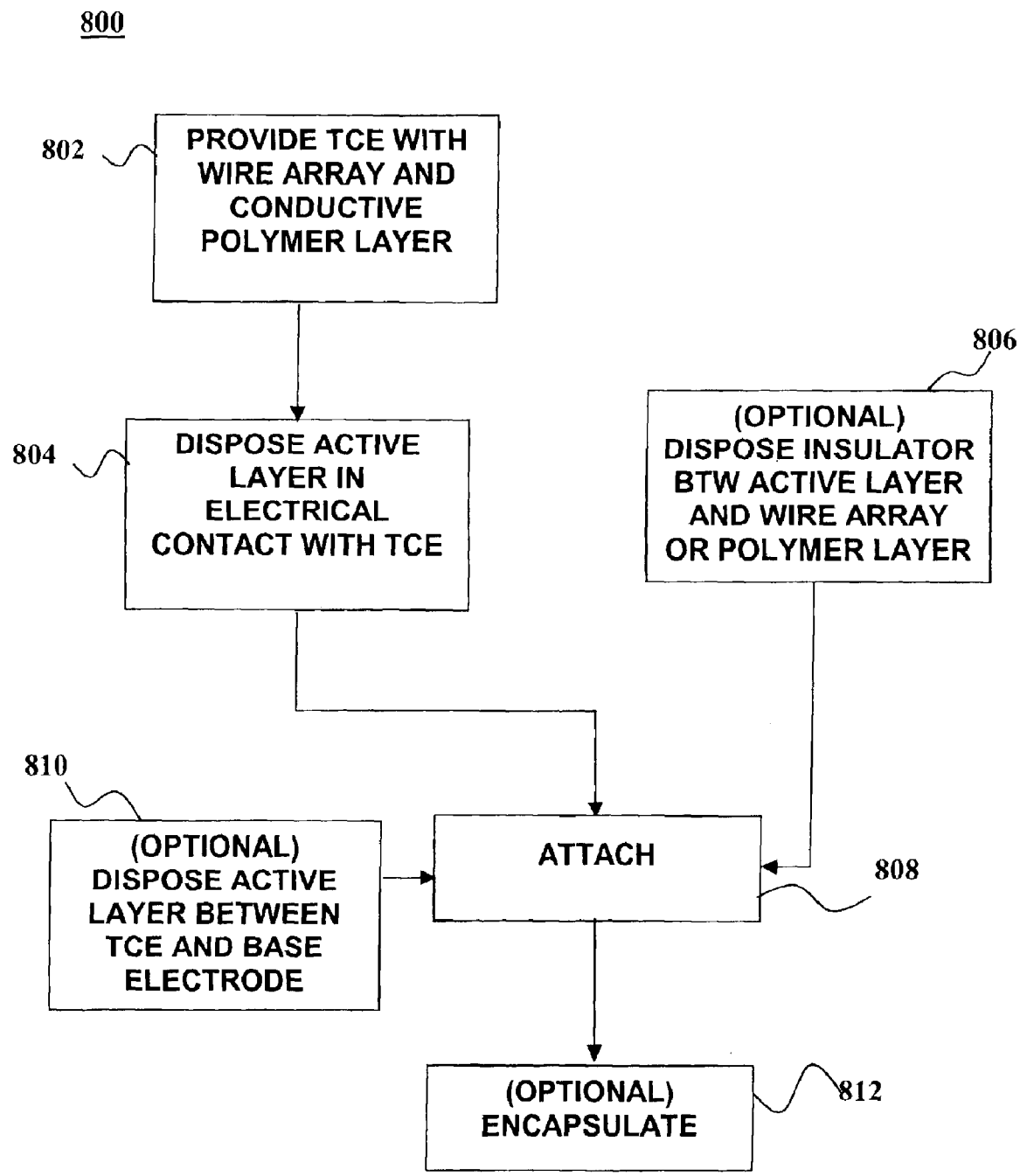
FIG. 8 depicts a flow diagram of a method for making optoelectronic apparatus and devices according to an embodiment of the present invention.

The method of FIG. 6 may be extended to the production of apparatus of the type described above with respect to FIGS. 2A–2E and devices of the type described above with respect to FIG. 5. For example, FIG. 8 depicts a flow diagram of a method 800 for fabricating an apparatus of the type shown in FIGS. 2A–2E and optionally incorporating such an apparatus into a device of the type shown in FIG. 5. The method 800 begins at 802 by providing a TCE having an array of conductive wires distributed across and in electrical contact with a layer of transparent conducting polymer material. At 804 an active layer is disposed in electrical contact with the TCE. This step may involve bringing the TCE and active layer into close proximity or physical contact. This step may also involve disposing an interface layer between the TCE and active layer. In the most likely scenario, is to start out with a substrate foil; form the active layer on the substrate foil at 804 and then form the TCE at 802. This could all be done in one continuous process.

At 806 an optional insulator material may be disposed between the active layer and either the wires or polymer layer of the transparent conductive electrode as described with respect to FIG. 2E. As a practical matter, this step may occur before step 804 by attaching the insulator material to the polymer layer or wires. Alternatively, the insulating material may be disposed in a pattern on the active layer.

At 808 the active layer is attached to the TCE to form the optoelectronic apparatus. The attachment process makes a mechanical attachment between the TCE and the active layer. The active layer may include organic and/or nanostructured semiconductor materials as described below. The attaching process may be part of the process by which the conductive wires are brought into electrical contact with the layer of transparent conducting polymer material to produce the TCE. To make an optoelectronic device, at 810, the active layer may be disposed between the TCE and an optional base electrode and the base electrode is attached to the active layer to form the device. The base electrode is attached to the free surface of the active layer (i.e., the surface to which the transparent conductive electrode is not attached). The base electrode may be attached to the active layer either before, after or concurrent with attaching the TCE to the active layer. The device may optionally be encapsulated at 812. Again, the most likely scenario is: substrate then base electrode then active layer then TCE.

The order of the steps in the method 800 depends on the nature of the fabrication process and, to some extent, on the nature of the active layer. Some of the steps may occur sequentially, others may occur simultaneously. For example, referring to FIG. 5, the active layer 501 may be built on the base electrode 508 and the transparent conducing electrode 502 may be separately fabricated as described above with respect to FIG. 6. The transparent conducting electrode 502 and the active layer 501 may then be laminated together to complete the apparatus or device. Alternatively it is possible build the transparent conductive electrode 502 first and then form the active layer 501 on the transparent electrode 502. The base electrode 508 may then be laminated to the exposed surface of the active layer 501. The encapsulant layers 510, 512 may be laminated to the rest of the device 500 e.g., by heating and compression in a vacuum. A commercially available device, such as a vacuum laminator, for example, can be used.

The preferred assembly sequence is as follows: First the base electrode 508 is attached to the substrate (e.g., encapsulant layer 510; then the active layer 501 is built up from the base electrode then the TCE 502 is formed on the active layer 501, e.g., as described with respect to FIG. 7A or FIG. 7B; finally, the encapsulant layer 512 is applied to the TCE.

By way of example, the device 500 may be constructed as follows. A commercially available sheet material such as such as C- or Cu-coated steel foil is used as a base for the device and the base electrode 508. A coating of a sol-gel based non-porous Titania film be disposed on the sheet material as the interface layer 511. The nanoscale grid network 505 may be a nanostructured porous Titania film formed on the interface layer 511. The porous titania film is dried and pores in the film are then filled with a hole accepting polymer such as polythiophene as the network filling material 507. The nanostructured porous titania film and hole-accepting polymer create a nanoscale, high-interfacial area charge-splitting and transporting network. A second, flat coating of polythiophene is then applied as the interface layer 509, followed by a layer of PEDOT, a transparent conducting polymer 504. The wire array 502, a fine copper mesh (50 $\mu$m wire diameter, 79% open area), is applied on top of the PEDOT. Lateral spaces between the wires 502 are filled with a clear thermoplastic material, which serves as the transparent material 503. Thin glass encapsulating layers 510, 512 may then be laminated to the device 500.

B. Forming the Active Layer

There are several approaches to forming the active layers referred to in FIGS. 2A–2E, FIG. 5 and steps 804, 806, and 810, of FIG. 8. One approach, among others is simply to dispose a two-layer structure between the base electrode and the transparent conducting electrode. The two-layer structure includes two semiconducting or conducting charge transfer layers having complementary charge transfer properties with respect to each other. Such an approach may be extended to active layers having more than two semiconducting or conducting layers. In roll-to-roll processing these, charge transfer layers may be layers of different conjugated polymers that are laminated to each other to form the active layer. Alternatively, a single layer of a blend or mixture of organic or organic and inorganic materials may be applied, for example a polymer blend or a polymer inorganic nanocrystal mixture. Such an active layer may be subsequently or simultaneously laminated between the TCE and base electrode to form the device. Alternatively, the two layers forming the active layer may be deposited on a sheet of base electrode material or the conductive polymer layer of the TCE, e.g., by spray coating, printing such as screen-printing, ink-jet printing, flexographic printing, gravure printing, micro-gravure printing, or the like, web coating, doctor blade coating, spin coating or dip coating.

Another approach to forming the active layer involves forming a nano-architected porous film. Examples of techniques for forming nano-architected porous films include (a) Intercalation and/or grafting of organic or polymeric molecules within a mineral lamellar network comprised, e.g., of clays, phosphates, phosphonates, etc.; (b) synthesis by electrocrystallisation of hybrid molecular assemblies; (c) impregnation of preformed inorganic gels; (d) synthesis from heterofunctional metallic alkoxides metallic halides or silsesquioxannes; (e) synthesis of hybrid networks through the connection of well-defined functional nanobuilding blocks; (f) Templated growth of inorganic or hybrid networks by using organic molecules and macromolecules as structure directing agents; and (g)

Templated growth using nanoparticles as structuring agents followed by removal of the nanoparticles, leaving behind a porous network.

Figure 9:
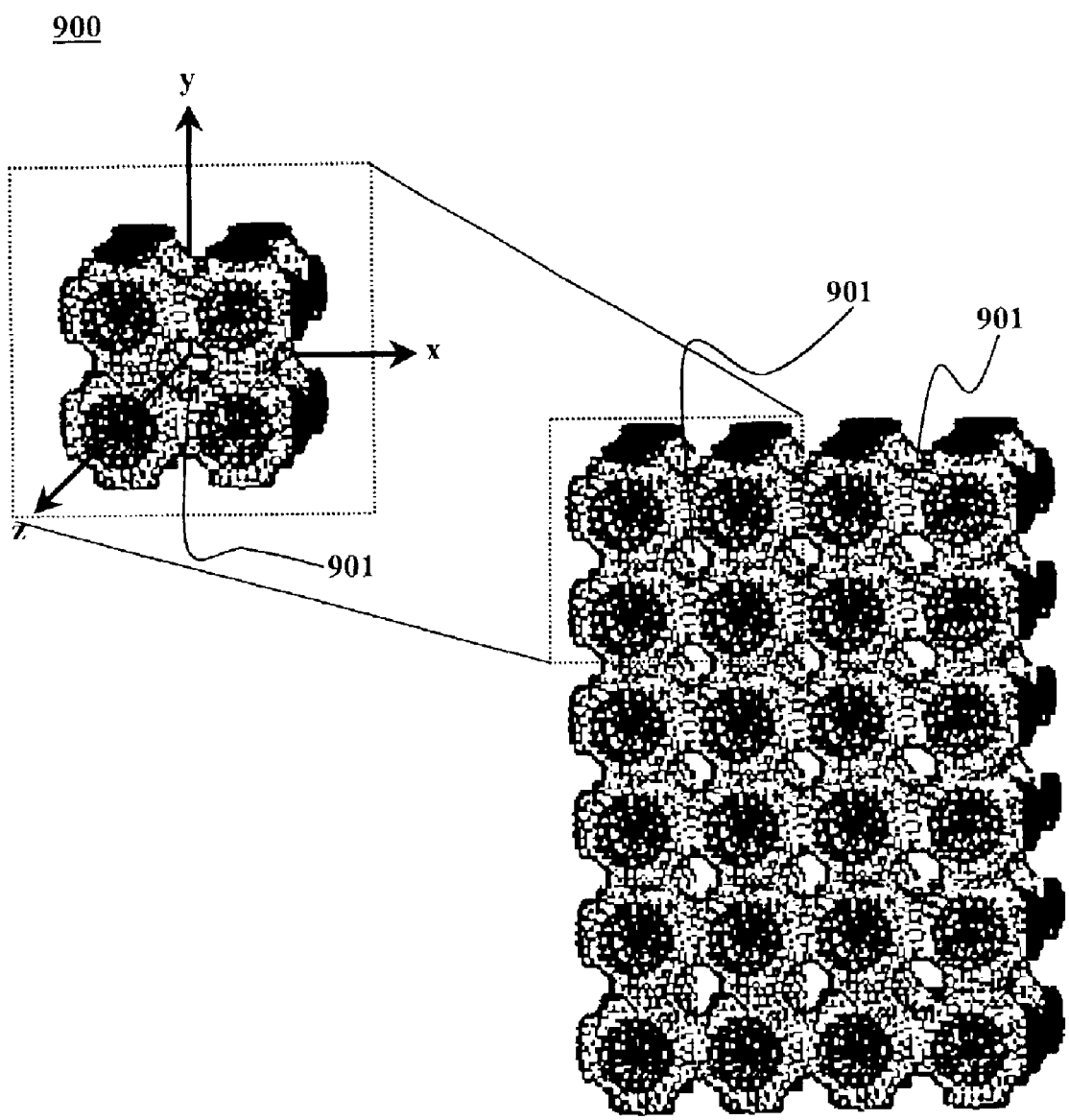
FIG. 9 depicts an isometric close-up view of a portion of a possible porous film structure.

FIG. 9 depicts a simplified and somewhat idealized diagram of a desirable morphology for the nano-architected porous film 900 having numerous pores 901 that are interconnected with each other. The pores run along x, y and z directions and intersect with each other as shown in the inset in FIG. 9. The pores 901 provide continuous paths between opposite surfaces of the nano-architected porous film 900. The path through the pores 901 provides access to the pores from a layer overlying or a layer underlying the surfactant-templated porous film 900. When the pores are filled with a semiconducting or conducting pore-filling material, charges have a path to migrate through the pore filling material from the overlying layer to the underlying layer and/or vice versa.

In one embodiment, among others, a nano-architected porous film may be fabricated by surfactant temptation using a precursor sol containing a mixture of one or more alkoxides, one or more surfactants one or more condensation inhibitors, water, and ethanol. Examples of suitable alkoxides where the central element in the alkoxides is silicon (Si) include polysiloxanes such as tetraethylorthosilicate (TEOS). Alternatively, the central element or inorganic network atom in the alkoxide may be e.g., Ag, Al, Au, B, Ba, Cd, Co, Cu, Fe, Ir, Mo, Nb, Ni, Pb, Se, Si, Sn, Sr, Ti, V, W, Y, Zn, Zr, etc.

Examples of suitable surfactants include compounds of the type: $HO(CH_2CH_2O)_n(CH_2CHCH_3O)_m(CH_2CH_2O)_nH$, where the subscripts m and n are integers. A particular surfactant of this type is the block copolymer poly(ethyleneoxide)-b-poly(propyleneoxide)-b-poly(ethyleneoxide) (EO20-PO70EO20), sometimes known commercially as Pluronic P123. Pluronic is a registered trademark of BASF Corporation of Ludwigshafen, Germany. Other suitable surfactants include hexadecyl trimethylammonium bromide (CTAB), polyoxyalkylene ether (e.g. Pluronic F127), and poly(oxyethylene) cetyl ether (e.g., Brij56 or Brij58). Brij is a registered trademark of Atlas Chemicals of Wilmington Del.

Examples of suitable condensation inhibitors include acids such as hydrochloric acid (HCl), sulfuric acid ($H_2SO_4$), nitric acid ($HNO_3$), etc., bases such as sodium hydroxide (NaOH), triethylamine, etc., and chelating agents, including acetyl acetone, alcohol amines, peroxides, etc.

A thin film may be prepared from the sol by spin-coating, web-coating, dip-coating, spray-coating, printing such as screen-printing, ink-jet printing, flexographic printing, gravure printing, micro-gravure printing, etc. onto a substrate. During the coating procedure, evaporation of the solvent causes the formation of surfactant-stabilized polypropylene microemulsions incorporated into a surfactant-templated material, which can be permanently fixed by annealing through exposure to heat and/or radiation. The annealing preferably occurs before the deposition of any material into the porous template film. Formation of nanostructured porous films is described in greater detail in commonly assigned U.S. patent application Ser. Nos. 10/290,119, 10/303,665, 10/319,406 (now U.S. Pat. No. 6,852,920) and Ser. No. 10/338,079, all of which have been incorporated herein by reference.

To form a charge-splitting network for the active layer, the pores within the nano-architected porous films described above may be substantially filled with a conducting or semiconducting material having complementary charge transfer properties with respect to the material of the nano-architected porous film. Examples suitable materials include those described above with respect to the active layers in FIGS. 2A–2E and FIG. 5. Techniques such as web coating, spray coating, spin coating, printing such as screen-printing, ink-jet printing, flexographic printing, gravure printing, micro-gravure printing, or the like, doctor blade coating, dip-coating, and the like may be used to deposit the material that fills the pores in the nano-architected film. The same techniques may be used to fill the spaces in a network grid where the nano-architected porous film has been etched away after filling the pores. This is a desirable scheme where, e.g., either the network grid, the network-filling material, or both are to be made from organic materials such as conjugated polymers.

Alternatively, the pores can be substantially filled by electrochemically growing metal or semiconductor within the pore channels of the nano-architected porous film. In such a technique, often referred to as electrodeposition, either the base electrode or the TCE may serve as a working electrode, which serves to attract ions from a solution and thus drive the formation of material within the pores.

B. Roll-to-Roll Processing

Figure 10A:
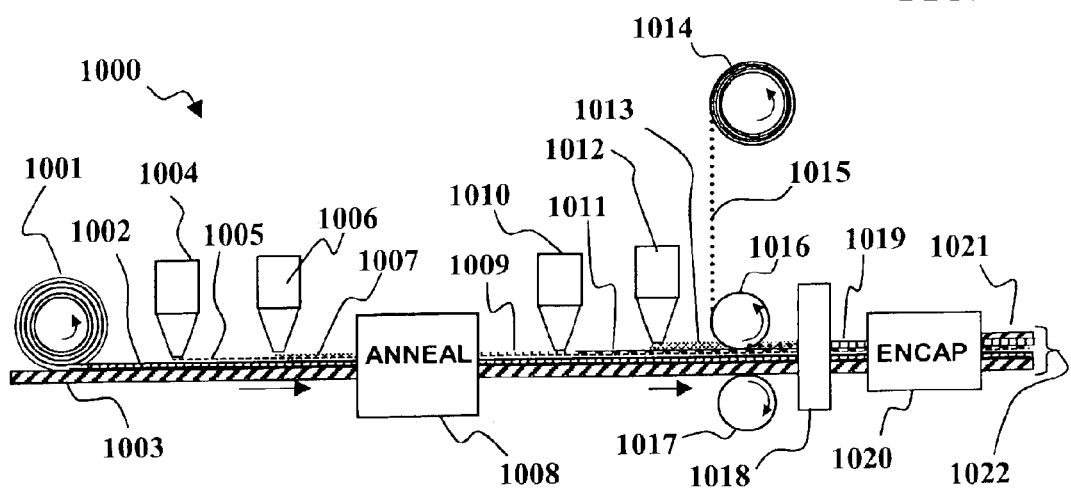
FIGS. 10A–10B depicts a schematic diagrams of a roll-to-roll processes for making optoelectronic devices according to an embodiment of the present invention.

Sheet processing or roll-to-roll processing of the type described with respect to FIGS. 7A–7C may be extended to the production of apparatus of the type described above with respect to FIGS. 2A–2E and devices of the type described above with respect to FIG. 5. FIG. 10A depicts a schematic diagram of a preferred example, of the use of roll-to-roll processing to produce apparatus of the types shown in FIGS. 2A–2E and devices of the type shown in FIG. 5. In FIG. 10A, arrows indicate the directions of travel of sheet material and the directions of rotation of rollers. The number and configuration of the rollers in FIG. 10A has been simplified for the sake of clarity.

Specifically in a sheet processing apparatus 1000 a feeder roller 1001 supplies base electrode material 1002 that is attached to a substrate 1003. Alternatively the feeder roller 1001 may supply a substrate 1003 with the base electrode material 1002 already attached. The base electrode material 1002 may be in the form of a commercially available sheet material such as copper, stainless steel or aluminum foil, metalized plastic foils, foils with transparent electrodes such as TCOs or conductive polymers with or without additional resistance-lowering metal traces that could be pre-deposited/patterned onto the substrate. Note that such polymer/metal or TCO/metal traces can be produced using means other than described herein (e.g. by sputtering, evaporating or electro-depositing a metal or alloy with subsequent lithographic patterning). Alternatively, the base electrode material 1002 material may be a completed transparent conducting electrode sheet, manufactured, e.g., as described above with respect to FIGS. 7A–7C. The substrate 1003 may be a glass or polymer material, which can serve as an encapsulant for the completed device. The substrate 1003 and base electrode material 1002 may be provide as a single sheet, e.g., a sheet/foil/roll with a pre-deposited base electrode (metal, TCO etc.). A conveyor belt (or a series of conveyor belts) or the like may carry the substrate 1003 through the subsequent stages of the apparatus 1000.

The substrate 1003 carries the electrode material 1002 past one or more dispensers, e.g., first and second dispensers 1004, 1006. The dispensers 1004, 1006 dispense materials that will form an interface layer 1005 and a nanostructured porous layer 1009. The dispensers 1004, 1006 may be conventional rollers, spray coaters, meniscus coater, bar-coater, gravure coater, Mayer rod, doctor blade, extrusion, micro-gravure, web coaters, doctor blade coaters, in-line printers (as above: screen, flexo, etc.) Generally, the materials that form the interface layer 1005 and nanostructured porous layer 1009 may be in the form of liquids (solutions, dispersions, emulsions, suspensions, etc) which may be applied by well-known web-coating techniques and the like. If the interface layer 1005 is to be deposited between the base electrode material 1002 and the nanostructured porous layer 1009, the first dispenser 1004 may deposit the interface layer 1005 as a substantially continuous layer of semiconducting material, such as $TiO_2$. A subsequent annealing stage (not shown) to anneal or otherwise process the interface layer 1005, e.g., by heating, exposure to radiation, a corona discharge or a plasma or some combination of these. The second dispenser 1006 then applies a precursor sol 1007 that will become the nanostructured porous layer 1009. Examples of precursor sols are described above.

The sheet material 1003 then passes though an annealing stage 1008 to process the precursor sol 1007 into the nanostructured porous layer 1009. As described above, the annealing stage 1008 may subject the precursor sol 1007 to heat irradiation corona discharge, plasma (also as above) to provide the desired level of cross-linking. After the nanostructured porous layer 1009 has been annealed, a third dispenser 1010 provides pore-filling material that fills the pores in the nanostructured porous layer 1009 to form a nanostructured active layer 1011. The third dispenser 1010 may be a web-coater, doctor blade coater, spray coater, or a printer such as printing such as screen-printer, ink-jet printer, flexographic printer, gravure printer, micro-gravure printer, etc. The substrate 1003 may pass through a curing unit (not shown) to evaporate solvents and set the pore-filling material and/or to assist material infiltration, e.g., through capillary action. Additional dispensers (not shown) or the third dispenser 1010 may deposit additional material onto the active layer 1011 to form a second interface layer as described above with respect to FIG. 5. An additional curing stage (not shown) may set and cure the interface layer.

Once the nanostructured active layer 1011 is complete, a TCE 1019 may be formed on top of the active layer in the manner described above with respect to FIG. 7A, 7B, or 7C. In the Example shown in FIG. 10A, a fourth dispenser 1012 applies to the active layer 1011 a process solution 1013 for forming a layer of transparent conducting polymer material. A feeder roller 1014 supplies a wire array 1015 that is laminated (with or without pressure) into the process solution 1013, e.g., by rollers 1016, 1017. The wire array 1015 may pass between an optional pair of compression rollers (not shown) to flatten the cross-sections of the wires. The substrate 1003 passes through a curing unit 1018 that evaporates solvent from the process solution 1013 and cures the process solution to attach the wire array 1015 to the layer of transparent conductive polymer to form the TCE 1019.

The TCE 1019 may alternatively be formed as shown in FIG. 7B, i.e., by adhering the wire array 1015 to the device layer first; applying the process solution 1013 over the active layer 1011 and the wire array 1015; and then curing in the curing unit 1018.

Once the TCE 1019 is in place, the device may be encapsulated. For example, an encapsulation unit 1020 may laminate an encapsulant layer 1021 over the TCE 1019 to from a completed device sheet 1022. The device sheet 1022 may be cut into smaller sections after encapsulation. Alternatively, the substrate 1003 may be cut into smaller sections at an earlier stage in the processing depicted in FIG. 10A. Furthermore, although the device sheet 1022 is shown as being built up from a substrate 1003 it is also possible to build the device sheet up starting from the base electrode sheet 1002; then build the active layer 1011 and TCE 1019; and then add encapsulant layers over both the base electrode 1002 and TCE 1019.

Another variation of the process described with respect to FIG. 10A is to fabricate the active layer 1011 using two organic semiconducting materials. For example organic semiconducting materials may be deposited on the base electrode 1002 in either single or multi-layers, with or without blends, etc.). The use of two organic semiconductor materials, e.g. polymers can make the active layer 1011 more flexible. If the substrate 1003 is made from a flexible material, e.g., a polymer, the unencapsulated device sheet can be rolled up into a roll after forming the TCE 1019. If flexible materials such as Mylar (e.g. with one or more dielectric barrier layers) are used as the encapsulant layer 1021, then the encapsulated device sheet 1022 may be rolled up into a roll.

In another variation, active layer 1011 may be formed as a hybrid organic/inorganic layer as follows. The pores in the nanostructured porous layer 1009 may be filled with an inorganic material, e.g., by electrodeposition. After filling the pores and before forming TCE 1019, the nanostructured porous layer 1009 may be etched away and the spaces left behind may be filled with an organic semiconductor having complementary charge-transfer properties with respect to the material that filled the pores.

Figure 10B:
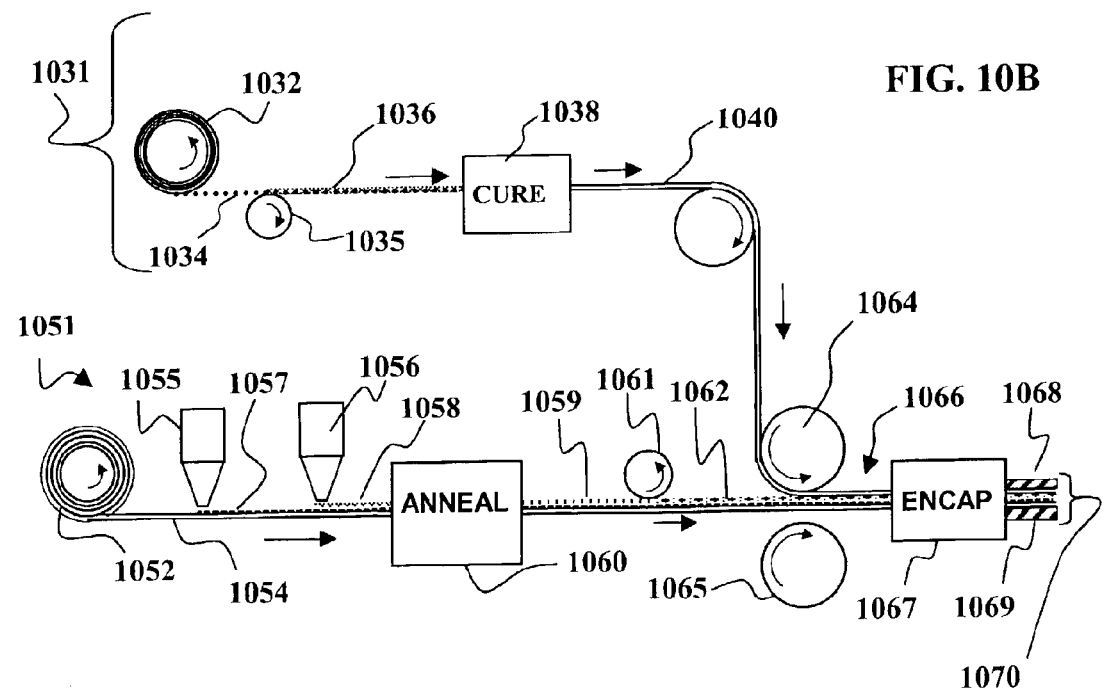

There are other variations on the apparatus 1000. For example, FIG. 10B depicts a roil-to-roll apparatus that incorporates features from FIG. 7C and FIG. 10A. The roll-to-roil apparatus 1030 includes a TCE-making section 1031 and an active-layer-making section 1051. In the TCE-maldng section, a feeder roll 1032 provides arrays of conductive wire 1034. An optional applicator roller 1035 may apply a polymer process solution that will form a layer of transparent conducting polymer. The applicator roller 1035 (or a different one) may also apply an adhesive and/or insulating material to the side of wire arrays 1034 to implement the features described above with respect to FIG. 2B and/or FIG. 2D. The wire arrays 1034 may pass between an optional pair of compression rollers (not shown) to flatten the cross-sections of the wires in the wire arrays 1034.

The wire arrays 1034 and process solution 1036 pass through a curing unit 1038, as described above, to set the process solution into the transparent conductive polymer to form a transparent conducting electrode sheet 1040.

The active-layer-making Section 1051 operates substantially as described above with respect to FIG. 10A. A feeder roll 1052 supplies base electrode material 1054. One or more dispensers 1055, 1056 dispense materials for forming an interface layer 1057 and a nanostructured porous layer 1059. For example, a first dispenser 1055 may deposit the interface layer 1057 as a substantially continuous layer of semiconducting material, such as $TiO_2$. The electrode material 1054 may pass through an annealing stage (not shown) to anneal or otherwise process the interface layer 1057. The base electrode material 1054 then passes a second dispenser 1056, which dispenses a precursor sol 1058 for forming the nanostructured porous layer 1059.

The base electrode material 1054 next passes through an annealing stage 1060 to process the precursor sol 1058 into the nanostructured porous layer 1059 as described above. After the nanostructured porous layer 1059 has been annealed, a third dispenser 1061 provides pore-filling material that fills the pores in the nanostructured porous layer 1059 to form a nanostructured active layer 1052. The base electrode material 1054 may pass through a curing unit (not shown) to evaporate solvents and set the pore-filling material. In the example of FIG. 10B, the third 1062 dispenser is depicted as being a roller-based dispenser.

The transparent conductive electrode sheet 1040 and the base electrode sheet 1054 are laminated or otherwise attached to each other with the active layer 1062 disposed between them, e.g., by some combination of heat and compression between a pair of rollers 1064, 1065. An optional second interface layer may be disposed between the nanostructured active layer and the conductive transparent electrode 1054 before laminating the transparent conductive electrode sheet 1054 and the base electrode sheet 1054 to form a device sheet 1066. The interface layer material, e.g., the same type of material used as the pore-filling material, may be applied to the exposed surface of the nanostructured active layer 1062. Alternatively, the interface layer material may be applied to an exposed surface of the transparent conductive electrode 1064, e.g., the conductive polymer layer 1036. It is also possible to apply the interface layer material to both the exposed surface of the nanostructured active layer 1062 and the transparent conductive electrode sheet 1040.

In an encapsulation unit, 1067, encapsulant layers 1068, 1069 may be attached to opposite sides of the device sheet 1066 e.g., by heating and compression in a vacuum to form an encapsulated device sheet 1070. A commercially available device, such as a vacuum laminator, for example, can be used for this stage of processing. Depending on the nature of the encapsulating process and encapsulant materials, the device sheet 1066 may be cut into individual optoelectronic devices and then encapsulated or encapsulated first and later cut into individual optoelectronic devices.

FIGS. 10A–10B depicts but two possible roll-to-roll processing schemes. Other variations on these schemes are within the scope of the present invention. For example, as described above, the active layers 1011, 1062 may be built up from a transparent conductive electrode instead of a base electrode. One way to do this is to start with a prefabricated conductive electrode on the feeder rollers 1001, 1052 in the place of the base electrode sheets 1002, 1054. Note that in this represents one way of producing an optoelectronic apparatus of the type described with respect to FIGS. 2A–2D.

In other variations, additional feeder rollers or metal deposition apparatus may be integrated into the roll-to-roll apparatus 1000 or 1030 to provide a thin metal layer for the TCEs 1019, 1040. Furthermore, the transparent conductive electrode 1040 may be prefabricated into a roll, e.g., as shown in FIG. 7C, prior to processing in the roll-to-roll apparatus 1030. In such a case the TCE-making section 1031 may be replaced with a feeder roller that feeds the completed TCE towards attachment to the active layer 1062. Furthermore, in the apparatus 1030, the location of the applicator roller 1035may be switched, such that the wire arrays 1034 are sandwiched between the active layer 1062 and the transparent conductive polymer layer formed from the process solution 1036. In such a case, an additional applicator roller (not shown) may apply a conducting or insulating adhesive to the wire arrays 1034 before attaching the transparent conductive electrode sheet 1040 to the active layer 1036.

VI. Alternative Embodiments

Alternative embodiments of the present invention include systems that incorporate multiple optoelectronic apparatus and devices of the types described herein. For example, two or more photovoltaic cells that incorporate transparent conducting electrodes of the types described above may be combined together in solar power generation systems. Such a power system may generally comprises an array of photovoltaic cells, at least one of which includes a transparent conducting electrode having a layer of transparent conducting polymer material, an array of wires distributed across the conducting polymer layer as described above.

To obtain higher aggregate voltages, two or more cells may be electrically connected in series. To obtain higher aggregate currents, two or more cells may be electrically connected in parallel. Furthermore, two or more series-wired stacks of cells may be connected together in parallel. Alternatively, two or more parallel-wired stacks of cells may be connected together in series.

The system may optionally include an energy storage device connected to the array. By way of example, the energy storage system may be in the form of one or more batteries, capacitors, or electrolytic cells for producing hydrogen from water using electricity generated by the cells. The system may include an optional DC-AC converter so that electric power produced by the system may be distributed over a conventional electric power grid. Because of the improved efficiency and lower manufacturing cost of photovoltaic cells that use transparent electrodes of the type described herein the system is potentially capable of producing electric power at a cost per kilowatt hour (kWh) competitive with conventional electric grid rates.

V. Conclusion

Embodiments of the present invention provide novel and useful transparent conducting electrodes and optoelectronic devices as well as methods for the manufacture of such electrodes and optoelectronic devices using such electrodes. The transparent conducting electrodes described herein are potentially less expensive to manufacture than conventional TCE's. Furthermore, TCEs of the type described herein can provide both increased optical transmission as well as lower resistance than prior art approaches.

It is to be understood that the above description is intended to be illustrative and not restrictive. Many embodiments and variations of the invention will become apparent to those of skill in the art upon review of this disclosure. Merely by way of example a wide variety of process times, reaction temperatures and other reaction conditions may be utilized, as well as a different ordering of certain processing steps. The scope of the invention should, therefore, be determined not with reference to the above description, but instead should be determined with reference to the appended claims along with the full scope of equivalents to which such claims are entitled.

What is claimed is:

1. An optoelectronic apparatus, comprising:
   a transparent electrode having:
      a layer of transparent electrically conducting polymer material, and an array of electrically conductive wires distributed across the layer of transparent electrically conducting polymer material, wherein the electrically conductive wires are in electrical contact with the layer of transparent conducting material; and
      an electrically insulating short-proofing material disposed between the wires and an underlying optoelectronically active layer, the short-proofing material being located at least at the middle and ends of the wires.

2. The apparatus of claim 1 wherein the layer of transparent electrically conducting polymer material is disposed between the optoelectronically active layer and the array of electrically conductive wires.

3. The apparatus of claim 1 wherein the array of electrically conductive wires is disposed between the optoelectronically active layer and the layer of transparent electrically conducting polymer material.

4. The apparatus of claim 1 further comprising a layer of transparent conducting oxide or an additional layer of transparent electrically conducting polymer material in electrical contact with the array of wires and/or the layer of transparent electrically conducting polymer material.

5. The apparatus of claim 1 wherein the short-proofing material is disposed between the array of wires and the layer of transparent electrically conducting polymer material.

6. The apparatus of claim 1 further comprising an adhesive disposed between the array of wires and the optoelectronically active layer.

7. The apparatus of claim 1 wherein the layer of transparent electrically conducring polymer material is chosen from the group of conductive polythiophencs, conductive polyanilines, conductive polypyrroles, PSS-doped PEDOT, a derivative of PEDOT, a derivative of polyaniline, or a derivative of polypyrrole.

8. The apparatus of claim 1 wherein the array of electrically conductive wires includes one or more wires having diameters of less than about 200 microns.

9. The apparatus of claim 8 wherein the array of electrically conductive wires includes one or more wires having diameters of less than about 100 microns.

10. The apparatus of claim 9 wherein the array of electrically conductive wires includes one or more wires having diameters of less than about 50 microns.

11. The apparatus of claim 1 further comprising a thin layer of metal or alloy disposed between the transparent electrode and the active layer.

12. The apparatus of claim 11 wherein the thin layer of metal or alloy is less than about 15 nm thick.

13. The apparatus of claim 11 wherein the thin layer of metal or alloy has a work function that is less than or greater than a work function of the layer of transparent electrically conducting polymer material.

14. The apparatus of claim 1, further comprising a short-proofing material disposed between the layer of transparent electrically conducting polymer material and the optoelectronically active layer.

15. The apparatus of claim 1, further comprising an electrically conductive adhesive disposed between the wires and the layer of transparent electrically conducting material.

16. The apparatus of claim 1 wherein one or more of the wires in the array is characterized by a cross-section flattened into an oval or elliptical shape.

17. The apparatus of claim 1 wherein adjacent wires in the array are parallel to each other and spaced apart by a distance of less than about 5 cm.

18. The apparatus of claim 17 wherein adjacent wires in the array are spaced apart by a distance of less than about 1 cm.

19. The apparatus of claim 18 wherein adjacent wires in the array are spaced apart by a distance of less than about 5 mm.

20. The apparatus of claim 19 wherein adjacent wires in the array are spaced apart by a distance of less than about 1 mm.

21. The apparatus of claim 1 wherein the array is characterized by a ratio of open area not covered by the wires in the array compared to an area covered by the wires in the array, wherein the ratio of open area is greater than 80%.

22. The apparatus of claim 21 wherein the ratio of open area is greater than 90%.

23. The apparatus of claim 22 wherein the ratio of open area is greater than 95%.

24. The apparatus of claim 1 wherein the array of wires includes a first set of wires running in a first direction and a second set of wires running in a second direction, wherein the second direction is different from the first direction, whereby the first and second sets of wires form a mesh having one or more openings.

25. The apparatus of claim 24, wherein adjacent wires in the first set are parallel to each other and spaced apart by a first distance, wherein adjacent wires in the second set are parallel to each other and spaced apart by a second distance, wherein the first and second distances are chosen such that an open area ratio of the mesh is greater than about 80%.

26. The apparatus of claim 1 wherein the optoelectronically active layer includes first and second semiconducting materials with different electron affinities, whereby the first and second materials have complementary charge transfer properties.

27. The apparatus of claim 26, wherein the first and second semiconducting materials are regularly arrayed and wherein the presence of the first and second semiconducting materials alternates within distances of between about 5 nm and about 100 nm.

28. The apparatus of claim 27 wherein the first and second semiconducting materials are arrayed using nanostructures chosen from the group of filled pores, nanolamellas, or matrixed nanostructures.

29. The apparatus of claim 26, further comprising a base electrode, wherein the active layer is disposed between the transparent electrode and the base electrode.

30. The apparatus of claim 29 wherein the apparatus is a photovoltaic device.

31. The apparatus of claim 30 wherein the apparatus is a solar cell.

32. The apparatus of claim 29 wherein the active layer includes one or more organic material.

33. The apparatus of claim 29 wherein the active layer includes both organic and inorganic materials whereby the device is a hybrid organic-inorganic solar cell.

34. A method for making an optoelectronic apparatus, the method comprising:
forming a transparent conducting electrode by:
distributing an array of conductive wires across a layer of transparent conducting polymer such that the conductive wires make electrical contact with the conducting polymer material; and
attaching the conductive wires to the conductive polymer material, and disposing an electrically insulating short-proofing layer between the array of conductive wires and an underlying optoelectronically active layer, the short-proofing material being located at least at the middle and ends of the wires.

35. The method of claim 34 wherein the array of conductive wires and/or the conductive polymer material are provided using a roll-to-roll process.

36. The method of claim 34, further comprising, making electrical contact between the active layer and the transparent conducting electrode.

37. The method of claim 36, wherein making electrical contact between the optoelectronically active layer and the transparent conducting electrode includes forming a nanostructured porous layer on an underlying sheet using a technique selected from the group of intercalation and/or grafting of organic or polymeric molecules within a mineral lamellar network; synthesis by electrocrystallisation of hybrid molecular assemblies; impregnation of preformed inorganic gels; synthesis from heterofunctional metallic alkoxides, metallic halides or silsesquioxannes; synthesis of hybrid networks through the connection of well-defined functional nanobuilding blocks; templated growth of inorganic or hybrid networks by using organic molecules and macromolecules as structure directing agents; and templated growth using nanoparticles, followed by removal of the nanoparticles.

38. The method of claim 37, further comprising filling pores in the nanostructured porous layer with a pore-filling material, wherein the nanostructured porous layer and pore-filling material have complementary charge transfer properties.

39. The method of claim 38, further comprising curing the pore-filling material.

40. The method of claim 39, wherein providing a transparent conducting electrode includes forming the transparent conducting electrode over the active layer after curing the pore filling material, whereby the active layer is disposed between the substrate and the transparent conducting electrode.

41. The method of claim 36, wherein making electrical contact between the optoelectronically active layer and the transparent conducting electrode includes forming the active layer on an exposed surface of the transparent conducting electrode.

42. The method of claim 34, further comprising:
providing a base electrode;
disposing the active layer between the base electrode and the transparent conducting electrode; and
attaching the base electrode, active layer and transparent conducting electrode together such that the active layer is disposed between the base electrode and the transparent conducting electrode.

43. The method of claim 42, wherein disposing the optoelectronically active layer between the base electrode and the transparent conducting electrode includes forming a nano-architected porous film on the base electrode or on an interface layer disposed between the base electrode and the nano-architected porous film.

44. The method of claim 43, further comprising filling pores in the nano-architected porous film with a pore-filling material, wherein the nano-architected porous film and the pore-filling material have complementary charge transfer properties.

45. The method of claim 44 further comprising curing the pore-filling material.

46. The method of claim 45 wherein providing a transparent conducting electrode includes forming the transparent conducting electrode over the optoelectronically active layer after curing the pore filling material, whereby the optoelectronically active layer is disposed between the substrate and the transparent conducting electrode.

47. The method of claim 42, further comprising, disposing a transparent conducting oxide, a thin metal layer or an additional layer of transparent conducting polymer material between the array of conductive wires and the active layer.

48. An optoelectronic apparatus, comprising:
a transparent electrode having:
    a layer of transparent electrically conducting polymer material; and
    an array of electrically conductive wires distributed across the layer of transparent electrically conducting polymer material, wherein the electrically conductive wires are in electrical contact with the layer of transparent conducting material;
an active layer including first and second semiconducting materials with different electron affinities, whereby the first and second materials have complementary charge transfer properties;
an electrically insulating short-proofing material disposed between the wires and the active layer, the short-proofing material being located at least at the middle and ends of the wires; and
a base electrode, wherein the active layer it disposed between the transparent conducting electrode and the base electrode,
wherein the active layer includes both organic and inorganic materials whereby the device is a hybrid organic-inorganic solar cell.

* * * * *